(12) United States Patent
Lee et al.

(10) Patent No.: US 11,727,985 B2
(45) Date of Patent: *Aug. 15, 2023

(54) METHOD OF OPERATING RESISTIVE MEMORY DEVICE TO INCREASE READ MARGIN

(71) Applicant: Samsung Electronics Co., Ltd., Suwon-si (KR)

(72) Inventors: Kwang-woo Lee, Hwaseong-si (KR); Han-bin Noh, Seoul (KR); Kyu-rie Sim, Hwaseong-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/369,211

(22) Filed: Jul. 7, 2021

(65) Prior Publication Data

US 2021/0335422 A1    Oct. 28, 2021

Related U.S. Application Data

(63) Continuation of application No. 16/390,201, filed on Apr. 22, 2019, now Pat. No. 11,087,840.

(30) Foreign Application Priority Data

Oct. 11, 2018 (KR) .......................... 10-2018-0121190

(51) Int. Cl.
*G11C 13/00* (2006.01)
*G11C 11/56* (2006.01)
(Continued)

(52) U.S. Cl.
CPC ...... *G11C 13/0069* (2013.01); *G11C 11/5678* (2013.01); *G11C 13/0004* (2013.01);
(Continued)

(58) Field of Classification Search
CPC ............ G11C 13/0069; G11C 11/5678; G11C 13/0004
See application file for complete search history.

(56) References Cited

U.S. PATENT DOCUMENTS 6,750,469 B2 * 6/2004 Ichihara ............. G11C 13/0069
                                                         315/105
7,639,522 B2 * 12/2009 Cho ........................ G11C 11/56
                                                         365/207

(Continued)

FOREIGN PATENT DOCUMENTS

JP          2014-75424 A     4/2014
KR    10-2010-0013125 A      2/2010

*Primary Examiner* — Vanthu T Nguyen
(74) *Attorney, Agent, or Firm* — Harness, Dickey & Pierce, P.L.C.

(57) ABSTRACT

A method of operating a resistive memory device to increase a read margin includes applying a write pulse to a memory cell such that the memory cell is programmed to a target resistance state, and applying a post-write pulse to the memory cell to increase a resistance of the memory cell that is in the target resistance state, the post-write pulse being applied as a single pulse having at least n stepped voltage levels, n being an integer equal to or more than 2, and an n-th stepped voltage level of the post-write pulse is set to be lower than a minimum threshold voltage level of the target resistance state that is changed by an (n-1)-th stepped voltage level of the post-write pulse.

13 Claims, 20 Drawing Sheets

(51) Int. Cl.
*H10B 63/00* (2023.01)
*H10N 70/20* (2023.01)
*H10N 70/00* (2023.01)

(52) U.S. Cl.
CPC ......... *G11C 13/0033* (2013.01); *H10B 63/80* (2023.02); *H10N 70/231* (2023.02); *H10N 70/882* (2023.02); *G11C 2013/0092* (2013.01)

(56) References Cited

U.S. PATENT DOCUMENTS

| | | |
|---|---|---|
| 7,817,475 B2 | 10/2010 | Lowrey |
| 7,821,810 B2 | 10/2010 | Liu |
| 8,031,517 B2 | 10/2011 | Kim et al. |
| 8,634,235 B2 | 1/2014 | Lung et al. |
| 8,976,568 B1 | 3/2015 | Jameson, III et al. |
| 9,142,289 B2 | 9/2015 | Takagi et al. |
| 9,349,948 B2 | 5/2016 | Chen et al. |
| 9,384,801 B2 | 7/2016 | Pandey et al. |
| 9,852,794 B2 | 12/2017 | Fantini et al. |
| 10,403,680 B2 | 9/2019 | Ohba et al. |
| 2010/0110778 A1 | 5/2010 | Lee et al. |
| 2011/0038195 A1 | 2/2011 | Hamilton et al. |
| 2017/0018306 A1 | 1/2017 | Lin et al. |
| 2017/0256314 A1 | 9/2017 | Lin et al. |

\* cited by examiner

METHOD OF OPERATING RESISTIVE MEMORY DEVICE TO INCREASE READ MARGIN

CROSS-REFERENCE TO RELATED APPLICATION

This is a continuation of U.S. application Ser. No. 16/390,201, filed Apr. 22, 2019, which claims priority to Korean Patent Application No. 10-2018-0121190, filed on Oct. 11, 2018, in the Korean Intellectual Property Office, the disclosure of which is incorporated herein in its entirety by reference.

BACKGROUND

Example embodiments of the inventive concepts relate to a non-volatile memory device, and more particularly, to a method of operating a resistive memory device, in which a post-write pulse is applied in a reset-directional write operation to increase a read margin of the resistive memory device.

Resistive memory devices, such as phase-change random access memory (PRAM), resistive RAM (RRAM), and magnetic RAM (MRAM), are known as non-volatile memory devices. The resistive memory devices employ, as memory cells, variable resistive elements configured to store data based on a change in a resistance state. A cross-point-type resistive memory device may be configured by arranging the memory cells at intersections between a plurality of bit lines and a plurality of word lines. A resistive memory device may apply a voltage to both ends of a memory cell and access the memory cell, and the accessed memory cell may store logic "1" (or set data or a low-resistance state) or logic "0" (or reset data or a high-resistance state) on the basis of a threshold resistance of the memory cell.

After the memory cells are programmed, resistance characteristics of the memory cells may be degraded as time elapses, such that threshold voltage distributions caused by a low-resistance state (set data) and a high-resistance state (reset data) of the memory cells may be increased at different resistance increase rates and modified. Due to a relatively large increase in the resistivity of the set data, a sensing margin or read margin between the set data and the reset data may be reduced, which may result in read errors. That is, when a non-overlapping interval (e.g., a read window (or sensing window)) between a threshold voltage distribution caused by low-resistance states and a threshold voltage distribution caused by high-resistance states is narrow, read errors may occur in a read operation on memory cells. Thus, to reduce read errors in a resistive memory device and ensure a read margin of the resistive memory device, it would be advantageous to develop a method of operating the resistive memory device, by which a read window may be increased.

SUMMARY

Some example embodiments of the inventive concepts provide a method of operating a resistive memory device, in which a post-write pulse is applied in a reset-directional write operation to increase a resistance of memory cells, thereby extending a read margin of the resistive memory device and reducing read errors.

According to some example embodiments of the inventive concepts, there is provided a method of operating a resistive memory device including memory cells. The method includes applying a write pulse to the memory cells such that the memory cells are in a target resistance state, and applying a post-write pulse to the memory cells to increase a resistance of the memory cells that are in the target resistance state. The post-write pulse is a single pulse having at least n stepped voltage levels (n is an integer equal to or more than 2).

According to some example embodiments of the inventive concepts, there is provided a method of operating a resistive memory device including memory cells. The method includes applying a write pulse to the memory cells such that the memory cells are in a target resistance state, and applying at least n post-write pulses to the memory cells to increase a resistance of the memory cells that are in the target resistance state (n is an integer equal to or more than 2).

According to some example embodiments of the inventive concepts, there is provided a resistive memory device including a memory cell array including memory cells, a write circuit configured to program the memory cells to a target resistance state, and a control circuitry configured to control a write pulse and a post-write pulse to be applied to the memory cells, wherein the post-write pulse follows the write pulse. The memory cells are programmed to the target resistance state in response to the write pulse, and a resistance of the memory cells that are in the target resistance state is increased in response to the post-write pulse.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
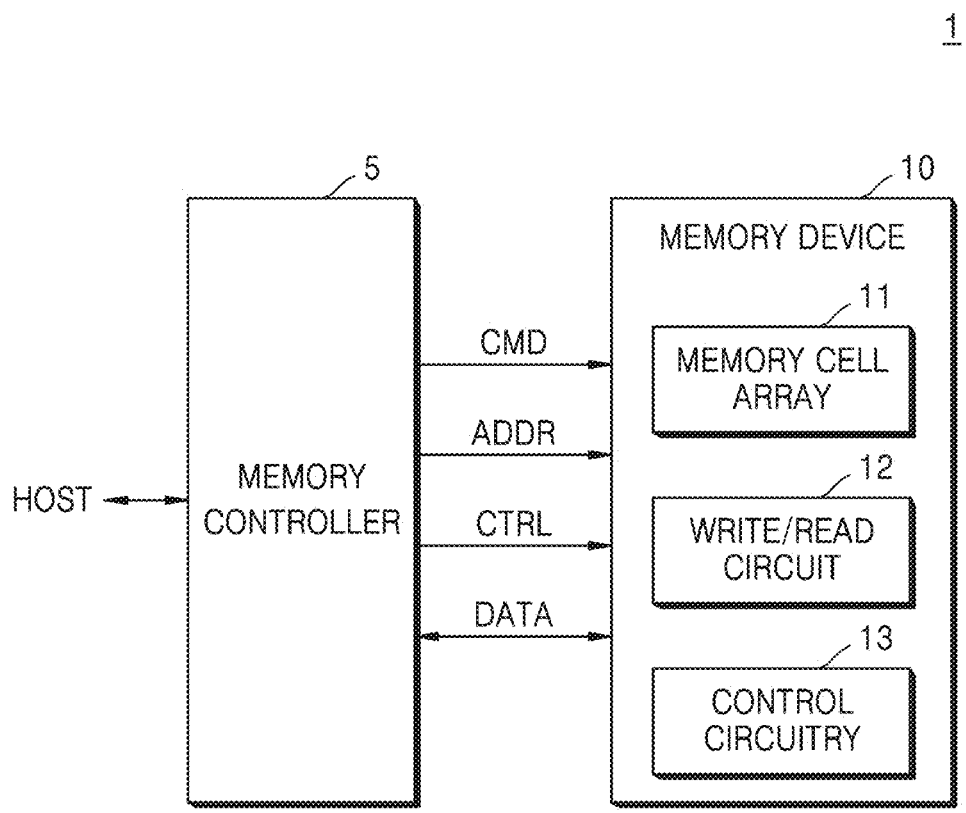
FIG. 1 is a block diagram of a memory system according to some example embodiments.

FIG. 1 is a block diagram of a memory system 1 according to some example embodiments.

Referring to FIG. 1, the memory system 1 may include a memory controller 5 and a memory device 10. The memory device 10 may include a memory cell array 11, a write/read circuit 12, and a control circuitry 13.

The memory controller 5 may control the memory device 10 to read data stored in the memory device 10 and/or write data to the memory device 10 in response to a read/write request from a host HOST. The memory controller 5 may provide an address ADDR, a command CMD, and a control signal CTRL to the memory device 10 and control a program (or write) operation and a read operation on the memory device 10. Also, write data DATA for the program operation and read data DATA for the read operation may be transceived between the memory controller 5 and the memory device 10.

Although not shown in FIG. 1, the memory controller 5 may include random access memory (RAM), a processing unit, a host interface, a memory interface, read-only memory (ROM), and/or a non-volatile memory. The RAM may be used as an operation memory of the processing unit, and the processing unit may control an operation of the memory controller 5. For example, the processing unit of the memory controller 5 may be implemented as a microprocessor (MP) or a central processing unit (CPU) configured to execute an operating system and/or software programs and perform specific calculations and/or tasks. The host interface may include a protocol configured to perform data exchange between the host HOST and the memory controller 5. For example, the memory controller 5 may be configured to communicate with the host HOST through at least one of various interface protocols, such as universal serial bus (USB), main machine communication (MMC), peripheral component interconnect-express (PCI-E), advanced technology attachment (ATA), serial-ATA (SATA), parallel-ATA (DATA), small computer system interface (SCSI), enhanced small device interface (ESDI), and integrated drive electronics (IDE).

The memory cell array 11 may include a plurality of memory cells respectively disposed at regions in which a plurality of first signal lines intersect a plurality of second signal lines. In some example embodiments, the plurality of first signal lines may be a plurality of bit lines, and the plurality of second signal lines may be a plurality of word lines. In some other example embodiments, the plurality of first signal lines may be a plurality of word lines, and the plurality of second signal lines may be a plurality of bit lines.

In the some example embodiments, the plurality of memory cells may include resistance-type memory cells or resistive memory cells including variable resistive elements having a variable resistance. For example, when the variable resistive elements include a phase-change material (e.g., germanium (Ge)-antimony (Sb)-tellurium (Te), GST) of which a resistance varies according to temperature, the memory device 10 may be phase-change RAM (PRAM). In some other example embodiments, when each of the variable resistive elements includes an upper electrode, a lower electrode, and a transition metal oxide located between the upper and lower electrodes, the memory device 10 may be resistive RAM (RRAM). In yet some other example embodiments, when each of the variable resistive elements includes an upper magnetic electrode, a lower magnetic electrode, and a dielectric material located between the upper and lower magnetic electrodes, the memory device 10 may be magnetic RAM (MRAM).

The write/read circuit 12 may program the memory cells and read the programmed memory cells. The write/read circuit 12 may program the memory cells to any one of $2^m$ resistance states (m is a natural number), and read the programmed memory cells. According to some example embodiments, the write/read circuit 12 may program the memory cells to a target resistance state having a relatively high resistance level, from among the $2^m$ resistance states (m is a natural number), and read the programmed memory cells. The write/read circuit 12 may perform a program operation of programming the memory cells to a target resistance state using a write pulse and a post-write pulse and perform a read operation of reading the programmed memory cells using a read voltage.

In a program operation, the control circuitry 13 may control the write pulse to be applied to the memory cells and control the post-write pulse, which follows the write pulse, to be applied to the memory cells. The memory cells may be switched to the target resistance state in response to the write pulse, and a resistance of the memory cells that are in the target resistance state may increase in response to the post-write pulse. According to some example embodiments, the control circuitry 13 may control the post-write pulse to be provided as a single pulse having at least n stepped voltage levels (n is an integer equal to or more than 2), and control each of the at least n stepped voltage levels to increase with a predetermined amplitude (a desired amplitude, a certain amplitude). According to some other example embodiments, the control circuitry 13 may control the post-write pulse to be provided as at least n multi-pulses, and control a voltage level of each of the at least n multi-pulses to increase with a predetermined amplitude (a desired amplitude, a certain amplitude).

The write/read circuit 12 and/or the control circuitry 13 of the memory device 10 may be implemented using hardware or a combination of hardware and software. Hardware of the write/read circuit 12 and/or the control circuitry 13 may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner. Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented one or more hardware devices, such as one or more of the hardware devices mentioned above in connection with the write/read circuit 12 and/or the control circuitry 13 of the memory device 10.

The memory controller 5 and the memory device 10 may be integrated into one semiconductor device. As a non-limiting example, the memory controller 5 and the memory device 10 may be integrated into one semiconductor device and constitute a memory card. For example, the memory controller 5 and the memory device 10 may be integrated into one semiconductor device and constitute a PC card (e.g., a personal computer memory card international association (PCMCIA) card), a compact flash (CF) card, a smart media card (SM/SMC), a memory stick, a multimedia card (MMC) (or a reduced-size MMC (RS-MMC) or MMC-micro), a secure digital (SD) card (or a mini-SD or a micro-SD card), or a universal flash storage (UFS) device. In another non-limiting example, the memory controller 5 and the memory device 10 may be integrated into one semiconductor device and constitute a solid-state disc/drive (SSD).

Figure 2:
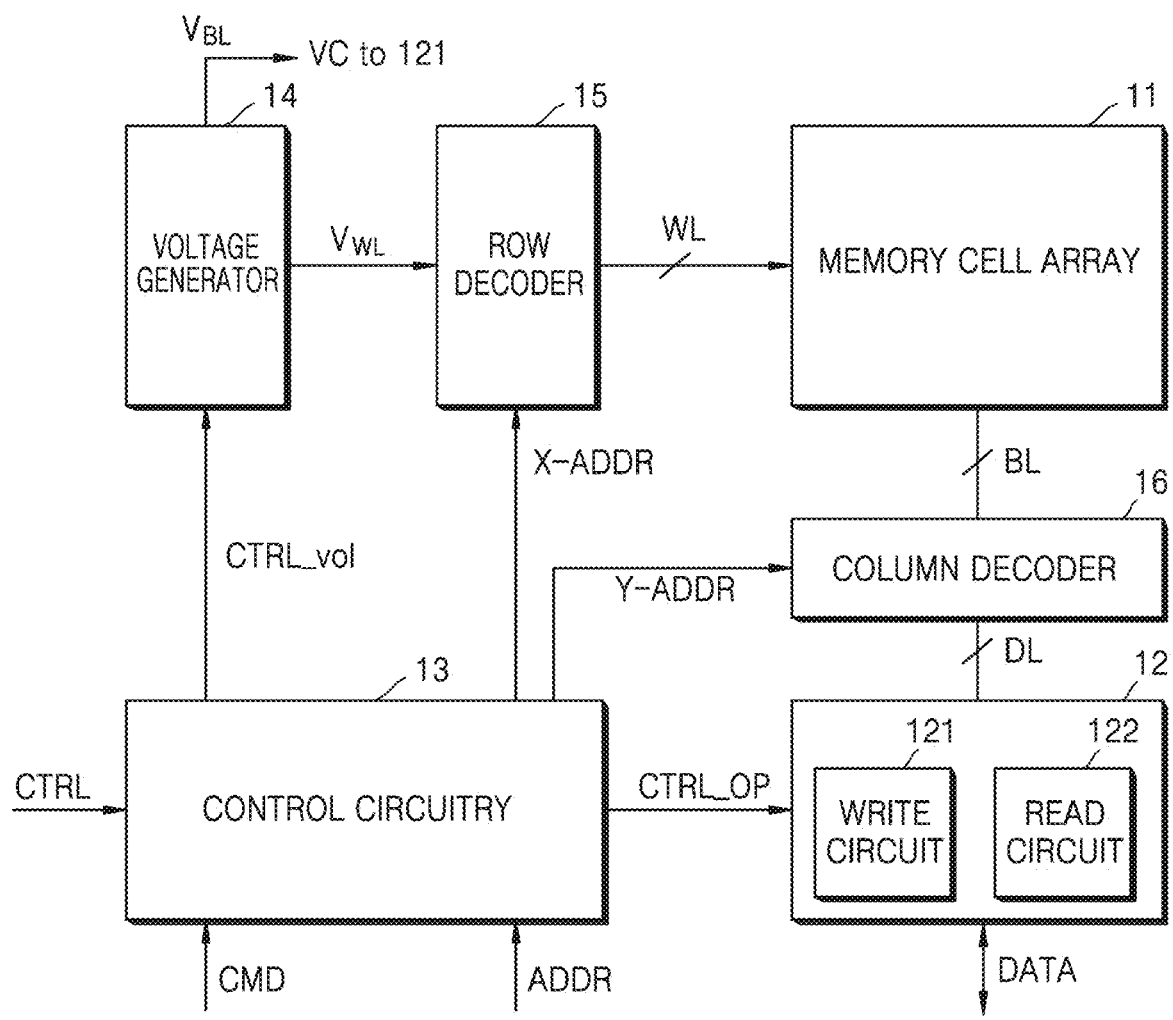
FIG. 2 is a block diagram of a memory device included in the memory system of FIG. 1, according to some example embodiments.
Figure 3:
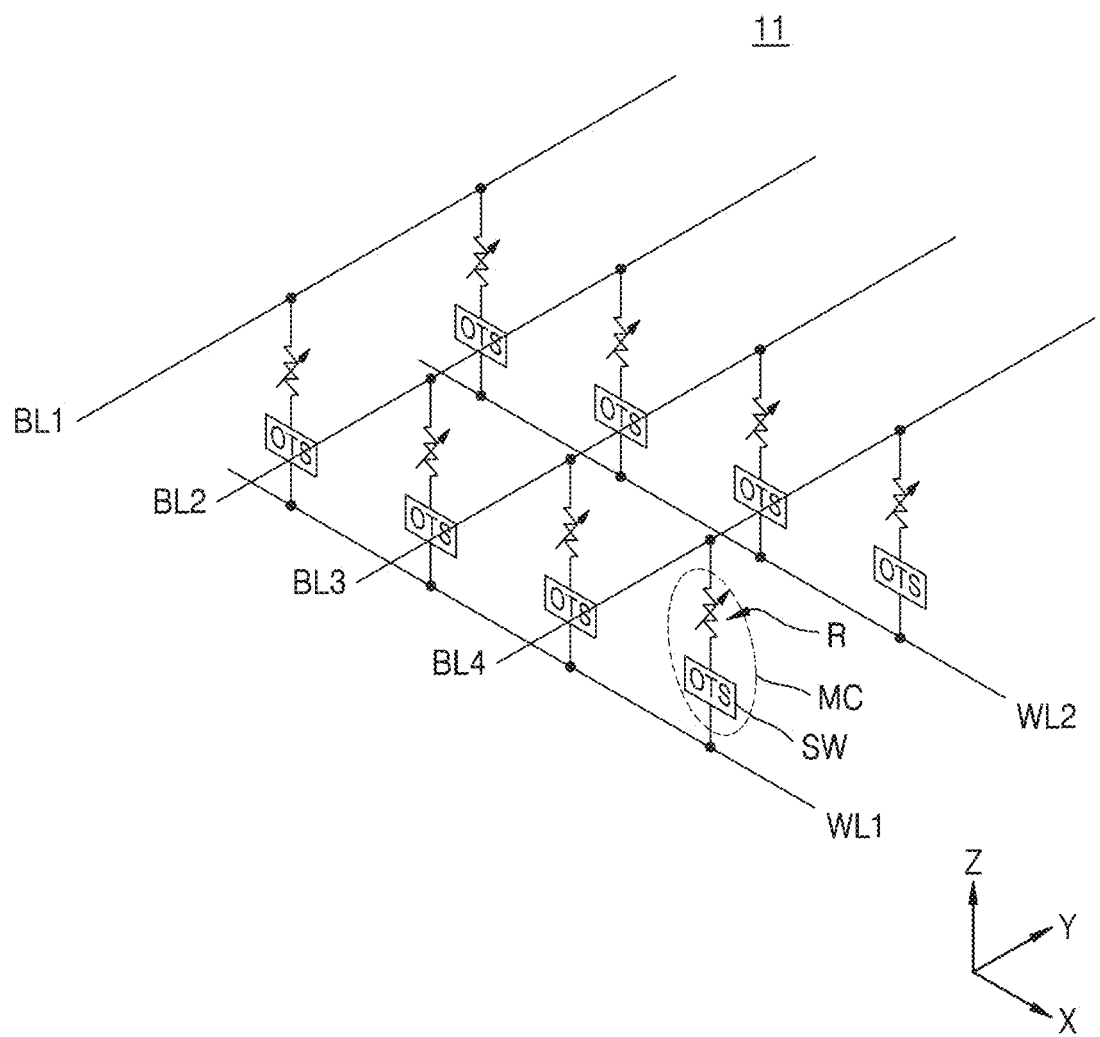
FIG. 3 is a circuit diagram of a memory cell array of FIG. 2, according to some example embodiments.

FIG. 2 is a block diagram of a memory device 10 included in the memory system 1 of FIG. 1, according to some example embodiments. FIG. 3 is a circuit diagram of a memory cell array of FIG. 2, according to some example embodiments.

Referring to FIG. 2, the memory device 10 may include a memory cell array 11, a write/read circuit 12, a control circuitry 13, a voltage generator 14, a row decoder 15, and a column decoder 16, and the write/read circuit 12 may include a write circuit 121 and a read circuit 122. Such components of the memory device 10 and/or the write/read circuit 12 of FIG. 2 may be implemented as hardware or a combination of hardware and software, including but not limited to the various examples discussed above with regard to the write/read circuit 12 and the control circuitry 13 of FIG. 1.

As shown in FIG. 3, the memory cell array 11 may include word lines WL1 and WL2, which may extend in a first direction (X direction) and may be spaced apart from each other in a second direction (Y direction) perpendicular to the first direction (X direction). The memory cell array 11 may include bit lines BL1, BL2, BL3, and BL4, which may be spaced apart from the word lines WL1 and WL2 in a third direction (Z direction) and extend in the second direction (Y direction). The memory cell array 11 may be a two-dimensional (2D) memory. In some example embodiments, when the memory cell array 11 has a multilayered structure, the memory cell array 11 may be a three-dimensional (3D) memory.

Memory cells MC may be respectively arranged between the bit lines BL1, BL2, BL3, and BL4 and the word lines WL1 and WL2. Specifically, the memory cells MC may be arranged at intersections between the bit lines BL1, BL2, BL3, and BL4 and the word lines WL1 and WL2, and may each include a selection element SW configured to select a variable resistive element R and the memory cell MC, which are configured to store information. The selection element SW may be called a switching element or an access element. The number of word lines WL, the number of bit lines BL, and/or the number of memory cells MC may be variously changed according to various example embodiments.

The memory cells MC may be arranged to have the same structure in the third direction (Z direction). For example, in the memory cell MC located between the word line WL1 and the bit line BL1, the selection element SW may be electrically connected to the word line WL1, the variable resistive element R may be electrically connected to the bit line BL1, and the variable resistive element R and the selection element SW may be connected in series. However, example embodiments of the inventive concepts are not limited thereto. According to some other example embodiments, unlike that shown in FIG. 3, positions of the selection element SW and the variable resistive element R in the memory cell MC may be exchanged. For example, in the memory cell MC, the variable resistive element R may be connected to the word line WL1, and the selection element SW may be connected to the bit line BL1.

In the memory cell array 11, the selection element SW may control the flow of current to the variable resistive element. R according to a voltage applied to the word lines WL1 and WL2 and the bit lines BL1, BL2, BL3, and BL4. The selection element SW may control the flow of current so that the variable resistive element R may be changed into an amorphous state (high-resistance state) or a crystalline state (low-resistance state). That is, the selection element SW may serve as an ovonic threshold switch (OTS) of a memory configured to switch a state of the variable resistive element R to any one of an on state and an off state.

The variable resistive element R may include a phase-change material layer that may be reversibly transitioned between a first state and a second state. The variable resistive element R is not limited thereto and may include any variable resistor of which a resistance varies according to an applied voltage. For instance, in a selected memory cell MC, a resistance of the variable resistive element R may be reversibly transitioned between the first state and the second state according to a voltage applied to the variable resistive element R.

Depending on a change in resistance of the variable resistive element 1 memory cell MC may store digital information, such as data '0' or '1', and erase digital information from the memory cell MC. For example, the memory cell MC may write data in a high-resistance state '0' and a low-resistance state '1.' Here, transition from the high-resistance state '0' to the low-resistance state '1' may be referred to as a 'set operation,' and transition from the low-resistance state '1' to the high-resistance state '0' may be referred to as a 'reset operation.' The memory cell MC according to some example embodiments is not limited to the digital information including the high-resistance state '0' and the low-resistance state '1' and may store various resistance states.

An arbitrary memory cell MC may be accessed by selecting the word lines WL1 and WL2 and the bit lines BL2, BL3, and BL4. The memory cell MC may be programmed by applying a predetermined signal (a desired signal, a certain signal) between the word lines WL1 and WL2 and the bit lines BL1, BL2, BL3, and BL4. Further, by measuring current through the bit lines BL1, BL2, BL3, and BL4, data (e.g., programmed data) of the corresponding memory cell MC may be read according to resistance of the variable resistive element R.

Referring back to FIG. 2, the write circuit 121 may be connected to a selected bit line BL and may provide a program current to a selected memory cell MC to perform a program operation (e.g., a write operation). Thus, the write circuit 121 may input data DATA to be stored to the memory cell array 11. Here, the program current may be referred to as a write current.

The write circuit 121 may perform a write operation on the memory cells MC when a write command is received from the memory controller 5. The write circuit 121 may perform a reset write operation of programming the memory cells MC in a direction in which a resistance of the memory cells MC increases. In the reset write operation, the write circuit 121 may program the memory cells MC to a target resistance state using a write pulse and a post-write pulse. The memory cells MC may be programmed to the target resistance state in response to the write pulse, and a resistance of the memory cells MC that are in the target resistance state may increase in response to the post-write pulse. Furthermore, the write circuit 121 may perform a set write operation of programming the memory cells MC in a direction in which the resistance of the memory cells MC is reduced.

The read circuit 122 may be connected to a selected bit line BL and read data DATA stored in a selected memory cell MC. When a read command is received from the memory controller 5, the read circuit 122 may perform a read operation on the memory cell MC. The read circuit 122 may read data of each of the memory cells MC and provide a reading result to the control circuitry 13.

The control circuitry 13 may output various control signals CTRL_OP and/or CTRL_VOL for writing data DATA to the memory cell array 11 and/or reading data DATA from the memory cell array 11 based on the command CMD, the address ADDR, and the control signal CTRL, which are received from the memory controller 5. The control circuitry 13 may provide operation control signals CTRL_OP to the write/read circuit 12. The operation control signals CTRL_OP may include a write enable signal WEN, a write control signal WCS, a read enable signal REN, a precharge signal PRE, and/or a discharge signal DIS. Also, the control circuitry 13 may provide a voltage control signal CTRL_VOL to the voltage generator 14. Furthermore, the control circuitry 13 may provide a row address X_ADDR to the row decoder 15 and provide a column address Y_ADDR to the column decoder 16.

The control circuitry 13 may control memory cells MC of all or some regions of memory blocks of the memory cell array 11 to be programmed to a target resistance state. The control circuitry 13 may control a write pulse having a single voltage level to be applied to the memory cells MC. The memory cells MC may be switched to the target resistance state in response to the write pulse.

In some example embodiments, the control circuitry 13 may control a post-write pulse, which follows the write pulse, to be applied to the memory cells MC. In some example embodiments, the control circuitry 13 may control the post-write pulse be provided as a single pulse having at least n stepped voltage levels to the memory cells MC. A resistance of the memory cells MC that are in the target resistance state may be increased in response to the post-write pulse having at least n stepped voltage levels.

In some other example embodiments, the control circuitry 13 may control at least n post-write pulses, which follow the write pulse, to be applied to the memory cells MC. A resistance of the memory cells MC that are in the target resistance state may be increased in response to the at least n post-write pulses.

The voltage generator 14 may generate various kinds of voltages to perform write and/or read operations on the memory cell array 11 based on a voltage control signal CTRL_vol. The voltage generator 14 may generate a first driving voltage $V_{WL}$ for driving the plurality of word lines WL and a second driving voltage $V_{BL}$ for driving the plurality of bit lines BL.

The voltage generator 14 may generate a control voltage VC for controlling a magnitude of a write current I of the memory cells MC in a program operation. The voltage generator 14 may generate the control voltage VC according to the voltage control signal CTRL_vol. The control voltage VC may be provided as types of a write pulse (refer to WP in FIG. 9) and post-write pulses (refer to P-WP and P-WPS in FIGS. 9 and 13). The write current I provided to the memory cells MC may increase according to the control voltage VC applied to the write pulse WP and/or the post-write pulses P-WP and P-WPS.

The row decoder 15 may be connected to the memory cell array 11 through the plurality of word lines WL and may activate a selected word line of the plurality of word lines WL in response to the row address X_ADDR received from the control circuitry 13. The row decoder 15 may control a voltage applied to the selected word line of the plurality of word lines WL and/or control a connection relationship of the selected word line in response to the row address X_ADDR.

The column decoder 16 may be connected to the memory cell array 11 through the bit lines BL and may activate a selected bit line of the plurality of bit lines BL in response to the column address Y_ADDR received from the control circuitry 13. The column decoder 16 may control a voltage applied to the selected bit line of the plurality of bit lines BL and/or control a connection relationship of the selected bit line in response to the column address Y_ADDR.

Figure 4:
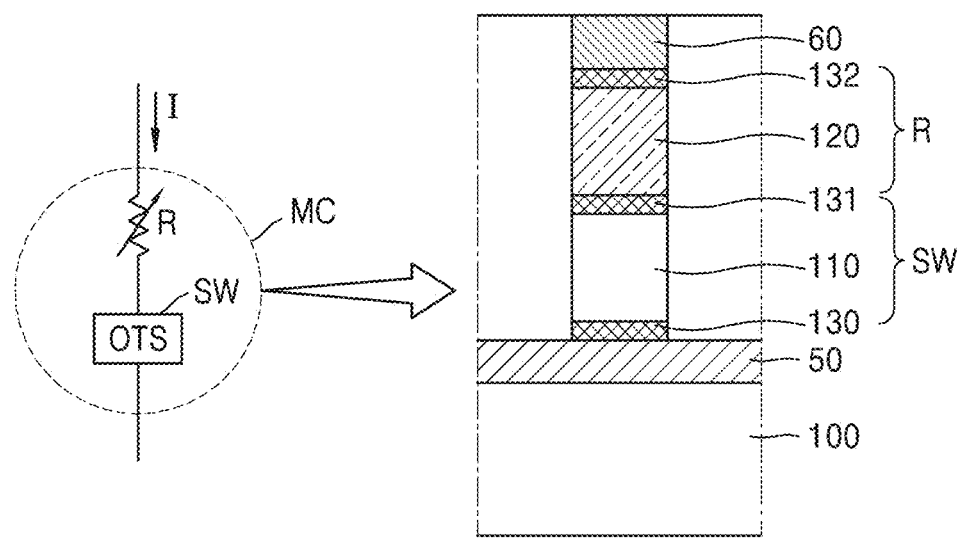
FIG. 4 is a diagram of a sectional structure of a memory cell of FIG. 3, according to some example embodiments.

FIG. 4 is a diagram of a sectional structure of the memory cell MC of FIG. 3, according to some example embodiments. Although FIG. 4 illustrates a case in which the sectional structure of the memory cell MC is a regular tetragonal structure, example embodiments of the inventive concepts are not limited thereto, and the sectional structure of the memory cell MC may have various other shapes according to some other example embodiments. For example, the sectional structure of the memory cell MC may have various shapes, such as a semi-circular shape, a semi-elliptical shape, a trapezoidal shape, and/or a triangular shape.

Referring to FIG. 4, the memory cell MC may store digital information due to a resistance change between various resistance states including a high-resistance state and a low-resistance state. The memory cell MC may include a selection element layer 110, a variable resistive element layer 120, a lower electrode 130, a middle electrode 131, and an upper electrode 132. The lower electrode 130 and the upper electrode 132 may be spaced apart from each other. The lower electrode 130 may be electrically connected to a first conductive line 50, and the upper electrode 132 may be electrically connected to a second conductive line 60. The first conductive line 50 may be formed on a substrate 100. As a non-limiting example, the first conductive line 50 may be one of the word lines (refer to WL1 and WL2 in FIG. 3), and the second conductive line 60 may be one of the bit lines (refer to BL1, BL2, BL3, and BL4 in FIG. 3).

The selection element layer 110 and the variable resistive element layer 120 may be disposed (located) between the lower electrode 130 and the upper electrode 132. The selection element layer 110 may be formed more adjacent to (located closer to) the lower electrode 130 than to the upper electrode 132, for example. The selection element layer 110 may be electrically connected to the lower electrode 130. The variable resistive element layer 120 may be disposed (located) between the upper electrode 132 and the selection element layer 110. The variable resistive element layer 120 may be formed more adjacent (located closer) to the upper electrode 132 than to the lower electrode 130. The variable resistive element layer 120 may be electrically connected to the upper electrode 132.

Although FIG. 4 illustrates a case in which the selection element layer 110 is located more adjacent (closer) to the substrate 100 than the variable resistive element layer 120, example embodiments of the inventive concepts are not limited thereto. According to some other example embodiments, unlike that shown in FIG. 4, the variable resistive element layer 120 may be located more adjacent (closer) to the substrate 100 than the selection element layer 110.

The middle electrode 131 may be located between the selection element layer 110 and the variable resistive element layer 120. The middle electrode 131 may be electrically connected to each of the selection element layer 110 and the variable resistive element layer 120. A selection element SW of the memory cell MC may correspond to a combination of the selection element layer 110, the lower electrode 130, and the middle electrode 131, and a variable resistive element R of the memory cell MC may correspond to a combination of the variable resistive element layer 120, the upper electrode 132, and the middle electrode 131.

Each of the lower electrode 130, the middle electrode 131, and the upper electrode 132 may include various metals, metal oxides, and/or metal nitrides. For example, each of the lower electrode 130, the middle electrode 131, and the upper electrode 132 may include aluminum (Al), copper (Cu), titanium nitride (TiN), titanium aluminum nitride (Ti$_x$Al$_y$N$_z$), iridium (Ir), platinum (Pt), silver (Ag), gold (Au), polysilicon, tungsten (W), titanium (Ti), tantalum (Ta), tantalum nitride (TaN), tungsten (WN), nickel (Ni), cobalt (Co), chromium (Cr), antimony (Sb), iron (Fe), molybdenum (Mo), palladium (Pd), tin (Sn), zirconium (Zr), zinc (Zn), iridium oxide (IrO$_2$), and/or strontium zirconate oxide (StZrO$_3$).

The variable resistive element layer 120 may include a resistance variation layer of which a resistance varies according to an electric field. As a non-limiting example, when the variable resistive element layer 120 includes a transition metal oxide, the memory device 10 may be IMAM, according to some example embodiments. When the variable resistive element layer 120 includes a phase-change material, of which a resistance varies according to temperature, the memory device 10 may be PRAM, according to some other example embodiments. When the variable resistive element layer 120 includes two magnetic electrodes and a dielectric material between the magnetic electrodes, the memory device 10 may be MRAM, according to yet some other example embodiments.

The variable resistive element layer 120 may include a phase-change material, of which a resistance state is changed due to Joule's heat, for example. The variable resistive element layer 120 may include a mixture of germanium, antimony, and tellurium (Ge—Sb—Te, GST). In some example embodiments, the variable resistive element layer 120 may include a chalcogenide material containing at least two elements selected out of silicon (Si), germanium (Ge), antimony (Sb), tellurium (Te), bismuth (Bi), indium (In), tin (Sn), and selenium (Se). In some other example embodiments, the variable resistive element layer 120 may include a chalcogenide material containing impurities of at least one element selected from boron (B), carbon (C), nitrogen (N), oxygen (O), phosphorus (P), and sulfur (S).

The selection element layer 110 may serve as an ovonic threshold switch (OTS) including a chalcogenide switching material, for example. The chalcogenide switching material may include a chalcogenide material that is further doped with at least one element selected from nitrogen (N), oxygen (O), phosphorus (P), and sulfur (S). In some example embodiments, the chalcogenide switching material may include arsenic (As) or selenium (Se), and may further include at least two elements selected from silicon (Si), germanium (Ge), antimony (Sb), tellurium (Te), selenium (Se), indium (In), and tin (Sn).

A GST material of the variable resistive element layer 120 may be programmed between an amorphous state having a relatively high resistivity and a crystalline state having a relatively low resistivity. The GST material may be programmed by heating, for example. A magnitude and a length of time of heating may determine whether the GST material remains in the amorphous state (high-resistance state) or the crystalline state (low-resistance state). A high resistivity and a low resistivity may indicate programmed values logic "0" and logic "1", respectively, and may be sensed by measuring resistivity of the GST material. Conversely, the high resistivity and the low resistivity may indicate programmed values logic "1" and logic "0", respectively.

Figure 5:
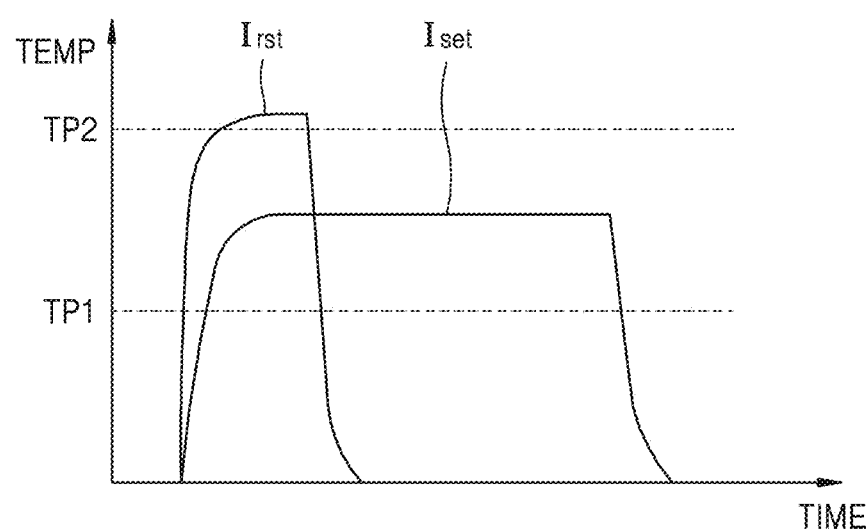
FIG. 5 is a graph illustrating a write current applied to the memory cell of FIG. 4, according to some example embodiments.

FIG. 5 is a graph illustrating a write current I applied to the memory cell MC of FIG. 4, according to some example embodiments.

Referring to FIG. 5, to put a variable resistive element layer 120 into an amorphous state (a high-resistance state or a reset state), a high reset write current Irst may be applied to the memory cell MC for a short amount of time and then eliminated. To put the variable resistive element layer 120 into a crystalline state (a low-resistance state or a set state), a set write current Iset, which is lower than the reset write current Irst, may be applied to the memory cell MC, and the applied set write current Iset may be maintained (e.g., the set write current Iset may be applied to the memory cell MC for a relatively longer period of time than the reset write current Irst) to crystallize the variable resistive element layer 120 and then eliminated. The memory cell MC may be set as any one of the crystalline state and the amorphous state according to the above-described method. Here, TP1 denotes a crystallization temperature of the variable resistive element layer 120, and TP2 denotes a melting point of the variable resistive element layer 120.

Figure 6:
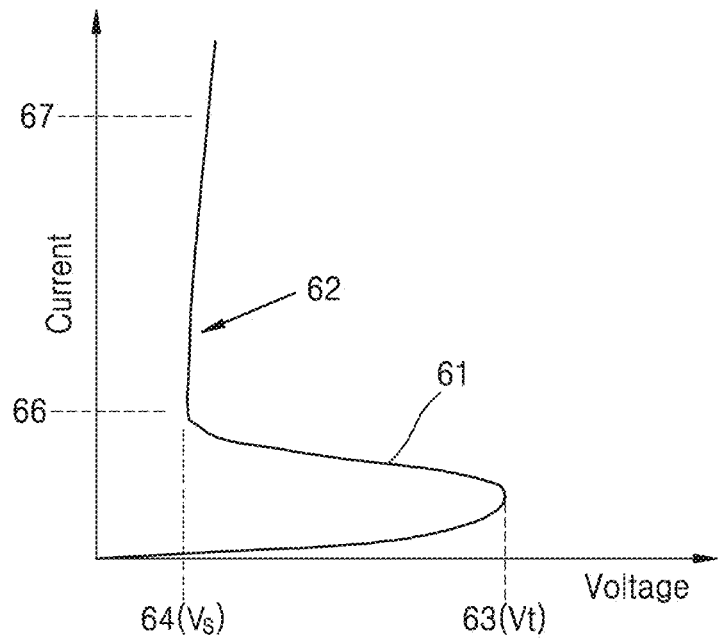
FIG. 6 is a graph illustrating voltage-current (V-I) characteristics of a selection element of the memory cell of FIG. 4, according to some example embodiments.

FIG. 6 is a graph illustrating voltage-current (V-I) characteristics of a selection element SW of the memory cell MC of FIG. 4, according to some example embodiments.

Referring to FIG. 6, the selection element SW of the memory cell MC may be implemented as an ovonic threshold switch (OTS) including a chalcogenide switching material. A first curve 61 shows a V-I relationship in a state (a first state) in which current is not supplied to the selection element SW. Here, the selection element SW may act as a switching element having a threshold voltage Vt having a first voltage level 63. When a voltage gradually increases in a state in which each of a voltage and a current is 0, current may hardly flow through the selection element SW until the voltage reaches the threshold voltage Vt having the first voltage level 63. Subsequently, as soon as the voltage exceeds the threshold voltage Vt, the current flowing through the selection element SW may rapidly increase, and the voltage applied to the selection element SW may be reduced to a saturation voltage Vs having a second voltage level 64, which is lower than the first voltage level 63. Here, it should be noted that the numbers '63' and '64' are reference characters, and do not represent actual voltage values.

A second curve 62 shows a V-I relationship in a state (a second state) in which current is supplied to the selection element SW. When the current supplied to the selection element SW becomes higher than a first current level 66, a voltage applied to the selection element SW may become slightly higher than the second voltage level 64. For example, while the current supplied to the selection element SW is considerably increasing from the first current level 66 to a second current level 67, the voltage applied to the selection element SW may slightly increase from the second voltage level 64. That is, once current flows through the selection element SW, the voltage applied to the selection element SW may be substantially maintained as a saturation voltage Vs. If the current supplied to the selection element SW is reduced to the first current level 66 or lower, the selection element SW may be switched again to a resistance state and may effectively block current until the voltage applied to the selection element SW increases to the threshold voltage Vt. Here, the first current level 66 may be referred to as a holding current level. Here, it should be noted that the numbers '66' and '67' are reference characters, and do not represent actual current values.

FIGS. 7A to 7D are graphs illustrating characteristics of memory cells when the memory cell MC of FIG. 4 is a single-level cell (SLC), according to some example embodiments.

Figure 7A:
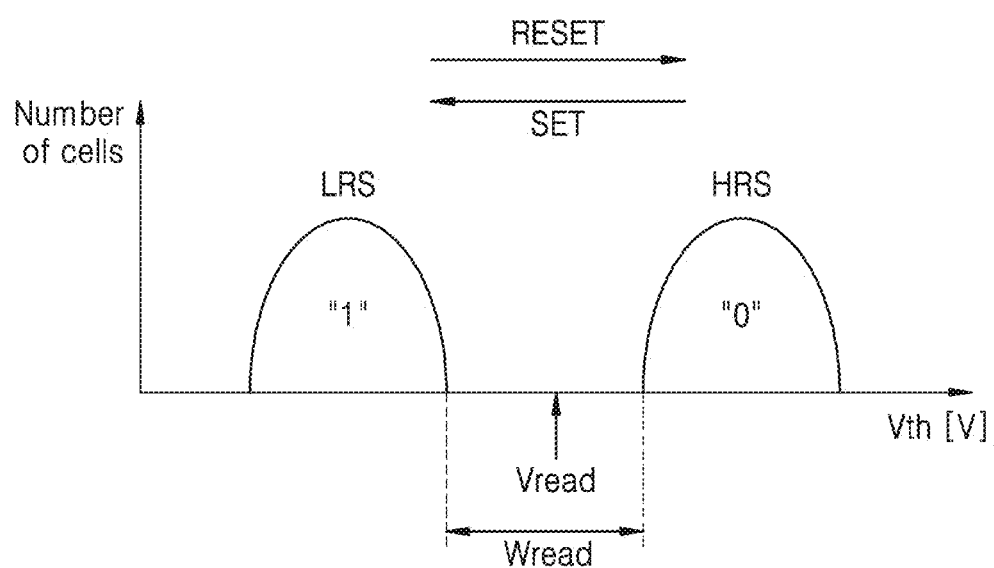
FIGS. 7A to 7C are graphs illustrating characteristics of memory cells when the memory cell of FIG. 4 is a single-level cell (SLC), according to some example embodiments.

FIG. 7A shows an ideal threshold voltage dispersion of SLCs, which are memory cells MC programmed with 1 bit. In FIG. 7A, the abscissa denotes a threshold voltage Vth of memory cells MC, and the ordinate denotes the number of memory cells MC. A variable resistive element R of the memory cell MC may have a low-resistance state LRS or a high-resistance state HRS. An operation of switching the variable resistive element R from the high-resistance state HRS to the low-resistance state LRS by applying a set write current (refer to Iset in FIG. 5) to the memory cell MC may be referred to as a set operation or a set write operation. Also, an operation of switching the variable resistive element R from the low-resistance state LRS to the high-resistance state HRS by applying a reset write current (refer to Irst in FIG. 5) to the memory cell MC may be referred to as a reset operation or a reset write operation.

A specific voltage between a dispersion caused by the low-resistance state LRS and a dispersion caused by the high-resistance state HRS may be set as a read voltage Vread. In a read operation on the memory cell MC, when a read data is equal to or higher than the read voltage Vread, the read data may be determined as reset data (logic "0") that is in the high-resistance state HRS, whereas, when the read data is equal to or lower than the read voltage Vread, the read data may be determined as set data (logic "1") that is in the low-resistance state LRS.

In the ideal threshold voltage dispersion of FIG. 7A it can be seen that a read window Wread is relatively wide on the basis of a read voltage Vread. The read window Wread refers to a non-overlapping threshold voltage interval between a dispersion caused by the low-resistance state LRS and a dispersion caused by the high-resistance state HRS. When the read window Wread is wide, the probability of read errors for reset data (logic "0") and/or set data (logic "1") in the read operation on the memory cell MC may be small. However, after memory cell MC is programmed, resistance characteristics of the memory cell MC may be degraded with respect to time as shown in FIGS. 7B and 7C.

Figure 7B:
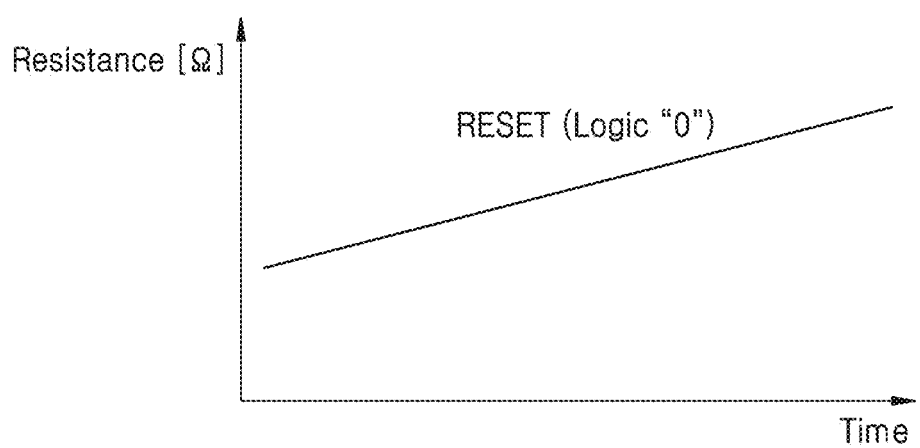

FIG. 7B shows exemplary characteristics of a memory cell that is programmed with reset data (logic "0") with the application of a reset write current Irst. In FIG. 7B, the abscissa denotes time, and the ordinate denotes resistance. Initially, resistivity of a target memory cell MC may behave so that a variable resistive element R may have a high resistance. However, after the memory cell MC is programmed with reset data (logic "0"), a resistance of the memory cell MC may greatly increase with respect to time.

Figure 7C:
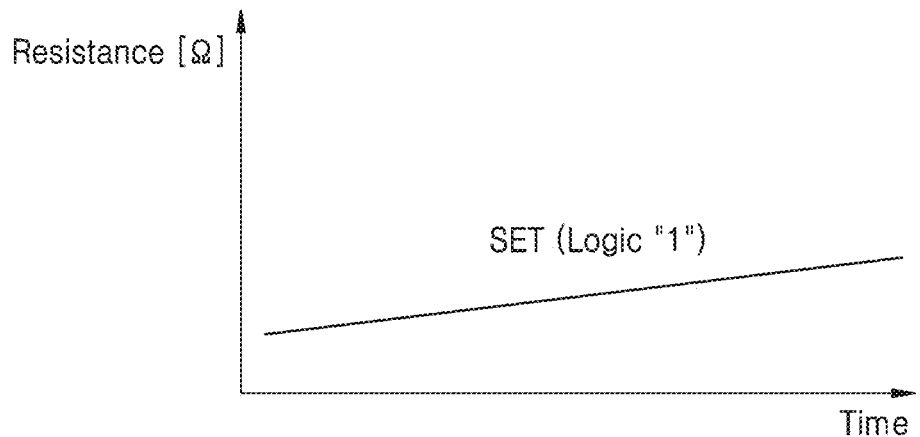

FIG. 7C shows exemplary characteristics of a memory cell that is programmed with set data (logic "1") with the application of a set write current Iset. In FIG. 7C, the abscissa denotes time, and the ordinate denotes resistance. Initially, resistivity of a target memory cell MC may behave so that a variable resistive element R may have a low resistance. However, after the memory cell MC is programmed with set data (logic "1"), a resistance of the cell MC may slightly increase with respect to time.

As shown in FIGS. 7B and 7C, after the memory cells MC are programmed, as time elapses, dispersions caused by the low-resistance state LRS and the high-resistance state HRS may be modified by changing resistances of the programmed memory cells MC. Thus, a read window Wread between the modified dispersions caused by the low-resistance state LRS and the high-resistance state HRS may be narrower than an ideal read window Wread (e.g., refer to FIG. 7A). In addition, the read window Wread may be further reduced with respect to time. This narrowing of the read window Wread over time may indicate that a sensing margin or read margin between set data (logic "1") and reset data (logic "0") is reduced. As a result, the sensing or reading of reset data (logic "0") and/or set data (logic "1") may become uncertain, slow, and/or generally unreliable. Thus, accuracy, speed, and/or reliability of a resistive memory device may be degraded because of the reduction of the read window Wread. Accordingly, it relay be advantageous to increase the read window Wread between the low-resistance state LRS and the high-resistance state. HRS to ensure a read margin of the memory cells MC, and thereby reduce read errors.

Figure 8:
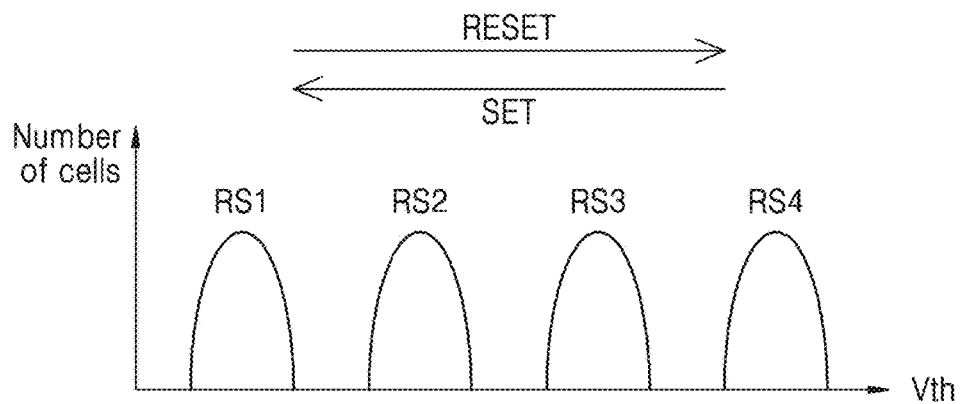
FIG. 8 is a graph showing a distribution of memory cells relative to a resistance when the memory cell of FIG. 4 is a multi-level cell (MLC), according to some example embodiments.

FIG. 8 is a graph showing a distribution of memory cells MC relative to resistance when the memory cell MC of FIG. 4 is a multi-level cell (MLC), according to some example embodiments. In FIG. 8, the abscissa denotes a threshold voltage Vth, and the ordinate denotes the number of memory cells MC.

Referring to FIG. 8, when the memory cell MC is an MLC that is programmed with 2 bits, the memory cell MC may have one of a first resistance state RS1, a second resistance state RS2, a third resistance state RS3, and a fourth resistance state RS4. However, example embodiments of the inventive concepts are not limited thereto, and in some other example embodiments, a plurality of memory cells may include triple-level cells (TLCs) configured to store 3-bit data. Thus, each of the plurality of memory cells may have one of eight resistance states. In yet some other example embodiments, the plurality of memory cells may include memory cells, each of which may store data of 4 bits or more.

Each of the resistance states RS1, RS2, RS3, and RS4 may correspond to any one of data '00,' data '01,' data '10,' and data '11.' In some example embodiments, resistance levels of the data "11," the data '01,' the data '00,' and the data '10' may be increased in sequential order. That the first resistance state RS1 may correspond to the data '11,' the second resistance state RS2 may correspond to the data '01,' the third resistance state RS3 may correspond to the data '00,' and the fourth resistance state RS4 may correspond to the data '10.'

As compared with an SLC, since an MLC has a narrow read window between resistance distributions, read errors may occur due to a small variation in threshold voltage. Furthermore, after MLCs are programmed, when the read window between the resistance distributions is further reduced with respect to time, further read errors may occur. Accordingly, to ensure a read margin of the MLCs and thereby reduce read errors, it may be advantageous to increase a non-overlapping read window between the first, second, third, and fourth resistance states RS1, RS2, RS3, and RS4.

Figure 9:
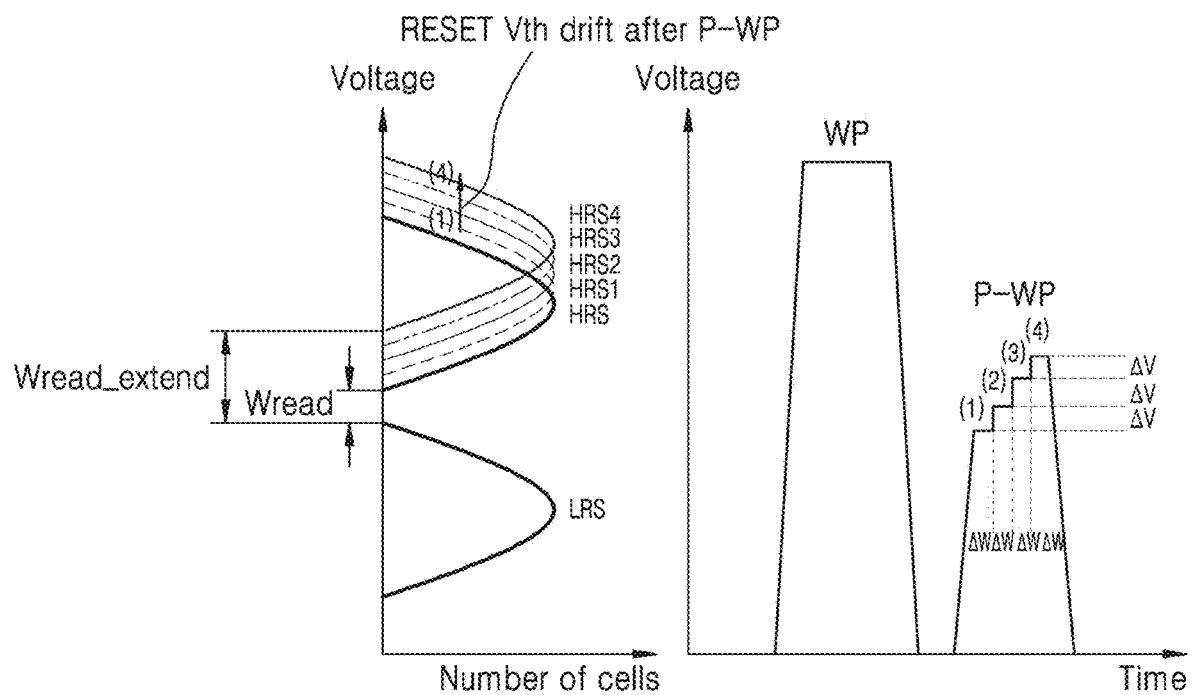
FIG. 9 is a diagram of a method of operating a memory device, according to some example embodiments.

FIG. 9 is a diagram for explaining a method of operating a memory device, according to some example embodiments.

Referring to FIG. 9, when memory cells (refer to MC in FIG. 3) are SLCs shown in FIG. 7A, a program operation may be performed such that a target resistance state caused by reset data to be programmed to the memory cell MC has a high-resistance state HRS. The operation of programming the reset data may be performed using a write pulse WP and a post-write pulse P-WP.

When the write pulse WP is provided to the memory cell MC, a reset write current (refer to Irst in FIG. 5) may be applied to the memory cell MC and thus, the memory cell MC may be switched to the high-resistance state HRS. Subsequently to the write pulse WP, the post-write pulse P-WP may be applied to the memory cell MC. The post-write pulse P-WP may be provided as a single pulse having at least n stepped voltage levels (n is an integer equal to or more than 2), according to some example embodiments. Hereinafter, the post-write pulse P-WP having four stepped voltage levels (1), (2), (3), and (4) will be described.

The four stepped voltage levels (1), (2), (3), and (4) of the post-write pulse P-WP may increase with a constant amplitude $\Delta V$, according to some example embodiments. Also, each of the four stepped voltage levels (1), (2), (3), and (4) of the post-write pulse P-WP may have a constant width $\Delta W$, according to some example embodiments.

When the post-write pulse P-WP is applied to the memory cell MC, the memory cell MC may be changed from the high-resistance state FIRS caused by the write pulse WP to first to fourth post high-resistance states HRS1 to HRS4. The first to fourth post high-resistance states HRS1 to HRS4 may be moved in a direction in which a resistance of the high-resistance state HRS increases in response to the post-write pulse P-WP. Thus, a read window Wread between a dispersion caused by a low-resistance state LRS and a dispersion caused by the high-resistance state FIRS due to the write pulse WP may extend to an extended read window Wread_extend between the dispersion caused by the low-resistance state LRS and a dispersion caused by the fourth post high-resistance state HRS4 due to the post-write pulse P-WP, according to some example embodiments.

FIGS. 10A to 10D are graphs illustrating the post-write pulse P-WP of FIG. 9, according to some example embodiments. FIGS. 10A, 10B, 10C and 10D specifically illustrate first, second, third, and fourth stepped voltage levels (1), (2), (3), and (4) of the post-write pulse P-WP, respectively.

Figure 10A:
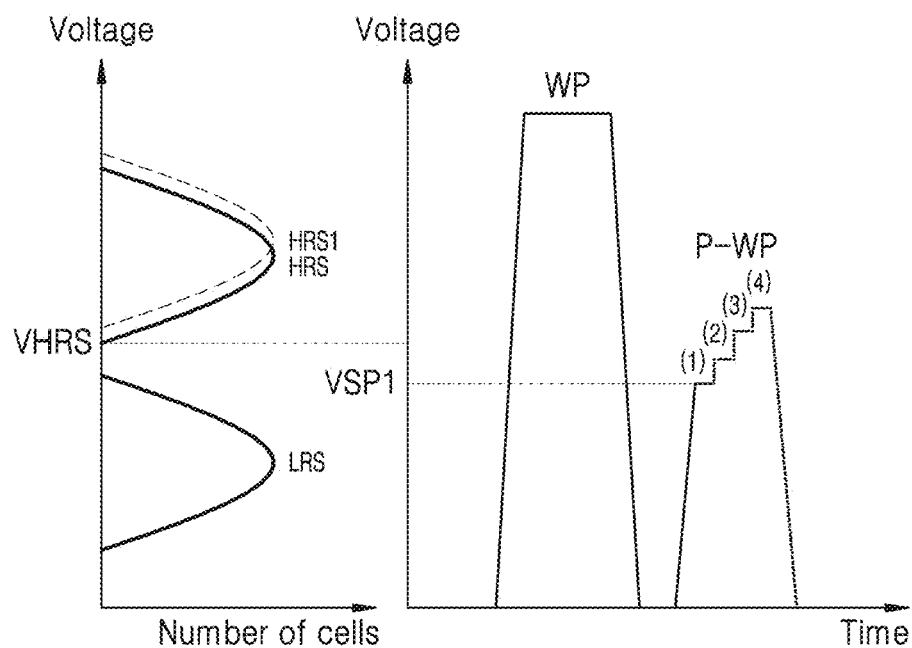
FIGS. 10A to 10D are graphs illustrating a post-write pulse of FIG. 9, according to some example embodiments.

In FIG. 10A, the memory cell (refer to MC in FIG. 3) may be switched to the high-resistance state HRS in response to the write pulse WP provided to the memory cell MC. The memory cell MC that is in the high-resistance state HRS may have a threshold voltage equal to or higher than a minimum threshold voltage VHRS required for switching the memory cell MC to the high-resistance state HRS. The first stepped voltage level (1) of the post-write pulse P-WP may be set to a voltage level VSP1, which is lower than the minimum threshold voltage VHRS of the high-resistance state HRS. The memory cell MC may be switched to the first post high-resistance state HRS1 due to the first stepped voltage level (1) of the post-write pulse P-WP provided to the memory cell (refer to MC in FIG. 3).

Figure 10B:
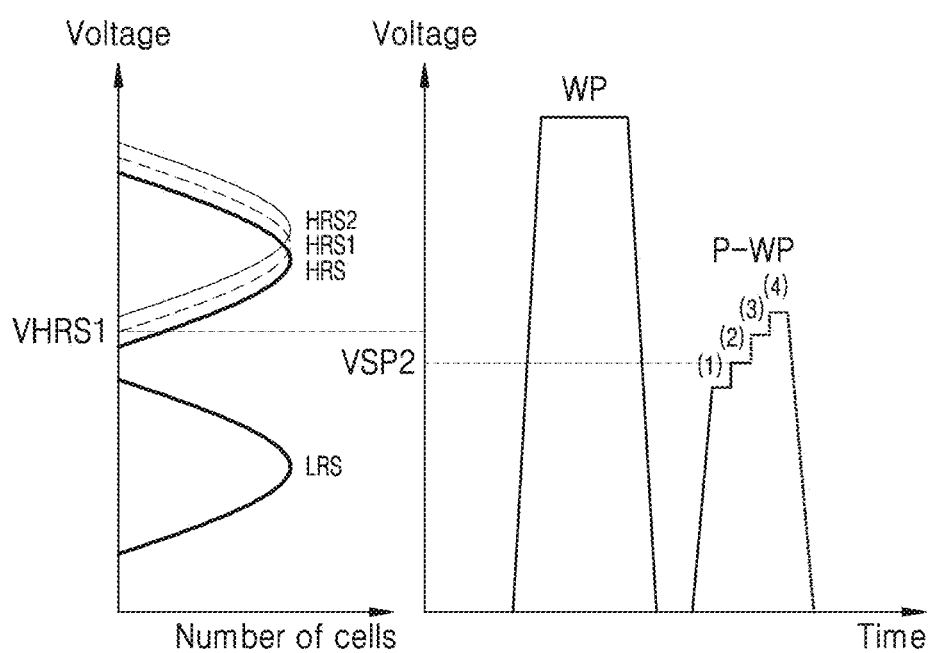

In FIG. 10B, the second stepped voltage level (2) of the post-write pulse P-WP may be set to a voltage level VSP2, which is lower than a minimum threshold voltage VHRS1 of the first post high-resistance state HRS1. The memory cell MC may be switched to the second post high-resistance state HRS2 due to the second stepped voltage level (2) of the post-write pulse P-WP provided to the memory cell (refer to MC in FIG. 3).

Figure 10C:
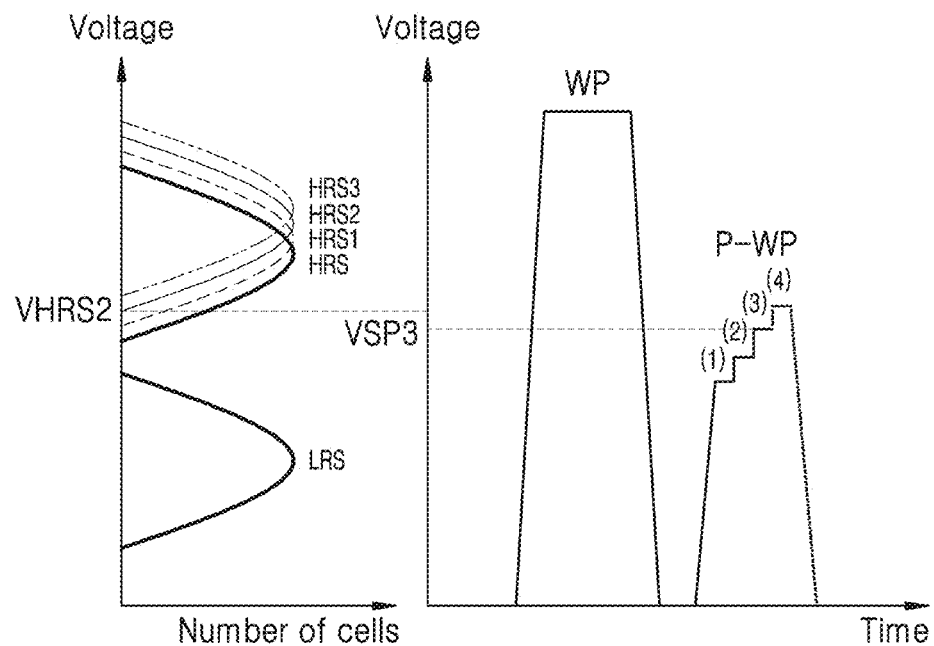

In FIG. 10C, the third stepped voltage level (3) of the post-write pulse P-WP may be set to a voltage level VSP3, which is lower than a minimum threshold voltage VHRS2 of the second post high-resistance state HRS2. The memory cell MC may be switched to the third post high-resistance state HRS3 due to the third stepped voltage level (3) of the post-write pulse P-WP provided to the memory cell (refer to MC in FIG. 3).

Figure 10D:
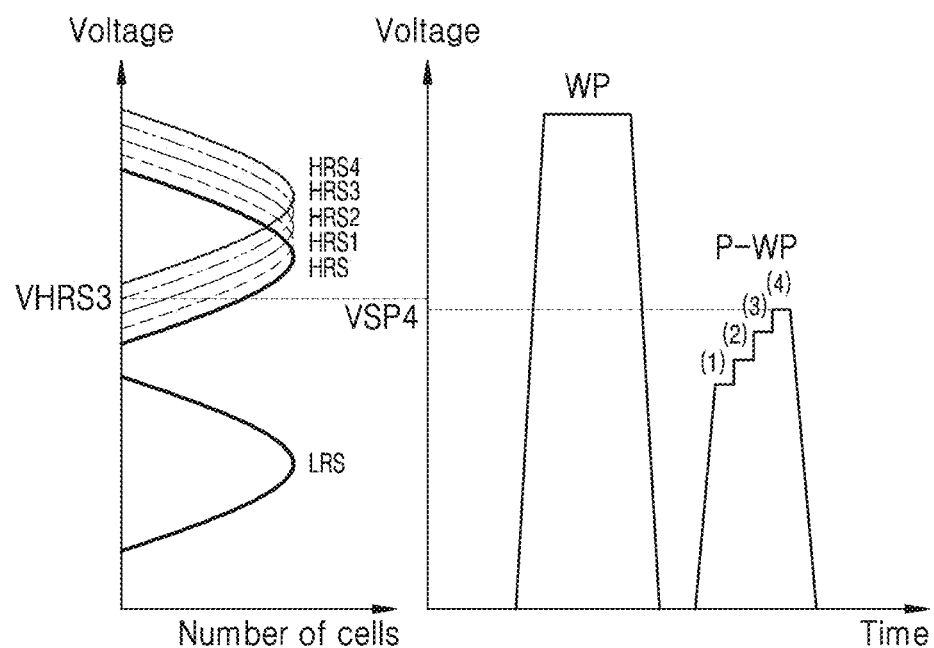

In FIG. 10D, the fourth stepped voltage level (4) of the post-write pulse P-WP may be set to a voltage level VSP4, which is lower than a minimum threshold voltage VHRS3 of the third post high-resistance state HRS3. The memory cell MC may be switched to the fourth post high-resistance state HRS4 due to the fourth stepped voltage level (4) of the post-write pulse P-WP provided to the memory cell (refer to MC in FIG. 3).

In FIGS. 10A to 10D the first stepped voltage level (1) or VSP1 of the post-write pulse P-WP may be set to be lower than a level of the minimum threshold voltage VMS of a target resistance state (e.g., the high-resistance state HRS) due to a previous write pulse WP. An n-th stepped voltage level of the post-write pulse P-WP may be set to be lower than a minimum threshold voltage level of a target resistance state (e.g., an (n−1)-th post high-voltage state) that is changed by an (n−1)-th stepped voltage level of the post-write pulse P-WP.

Here, the n-th stepped voltage level of the post-write pulse P-WP may be set to be lower than the minimum threshold voltage level of the (n−1)-th post high-voltage state that is changed by the (n−1)-th stepped voltage level of the post-write pulse P-WP so that the memory cell MC may be prevented from being reprogrammed to a resistance state other than the target resistance state. The memory cell MC may be programmed to a target resistance state having a relatively high resistance state, from among $2^m$ resistance states (m is a natural number). As a non-limiting example, it is assumed that the target resistance state of the memory cell MC is the second resistance state RS2 in the MLC of FIG. 8. In this case, when the n-th stepped voltage level of the post-write pulse P-WP is set to be higher than the minimum threshold voltage level of the (n−1)-th post high-voltage state, the memory cell MC may be programmed not to the second resistance state RS2, but rather may be programmed to the third resistance state RS3 or the fourth resistance state RS4.

FIGS. 11A to 11D are graphs illustrating modified examples of the post-write pulse P-WP of FIG. 9, according to some other example embodiments. FIGS. 11A to 11D illustrate non-limiting examples in which stepped voltage levels of the post-write pulse P-WP are set to various amplitudes (e.g., refer to FIGS. 11A and 11B) and/or widths (e.g., refer to FIGS. 11C and 11D).

Figure 11A:
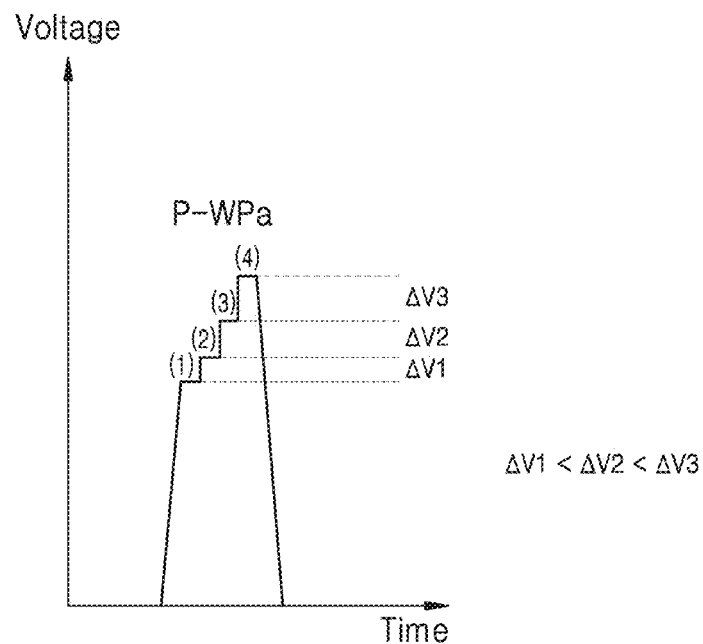
FIGS. 11A to 11D are graphs illustrating modified examples of the post-write pulse of FIG. 9, according to some other example embodiments.
Figure 11B:
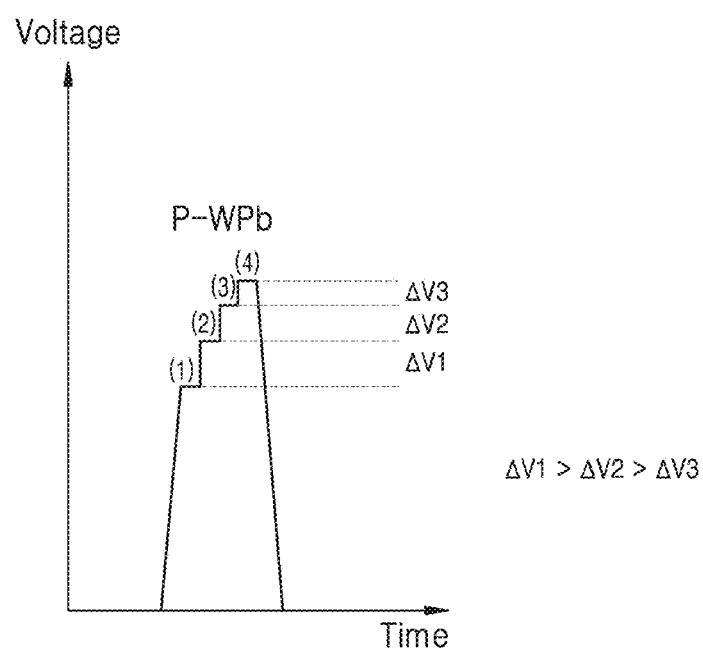

In FIG. 11A, first to fourth stepped voltage levels (1), (2), (3), and (4) of a post-write pulse P-WPa may increase with different amplitudes. It is assumed that a difference between the first stepped voltage level (1) and the second stepped voltage level (2) of the post-write pulse P-WPa is $\Delta V1$, a difference between the second stepped voltage level (2) and the third stepped voltage level (3) of the post-write pulse P-WPa is ΔV2, and a difference between the third stepped voltage level (3) and the fourth stepped voltage level (4) of the post-write pulse P-WPa is ΔV3. The amplitudes of the first to fourth stepped voltage levels (1), (2), (3), and (4) of the post-write pulse P-WPa may be set as gradually increased values (e.g. ΔV1<ΔV2<ΔV3).

In 11B, amplitudes of first to fourth stepped voltage levels (1), (2), (3), and (4) of a post-write pulse P-WPb may be set as gradually reduced values (e.g., ΔV1>ΔV2>ΔV3).

Figure 11C:
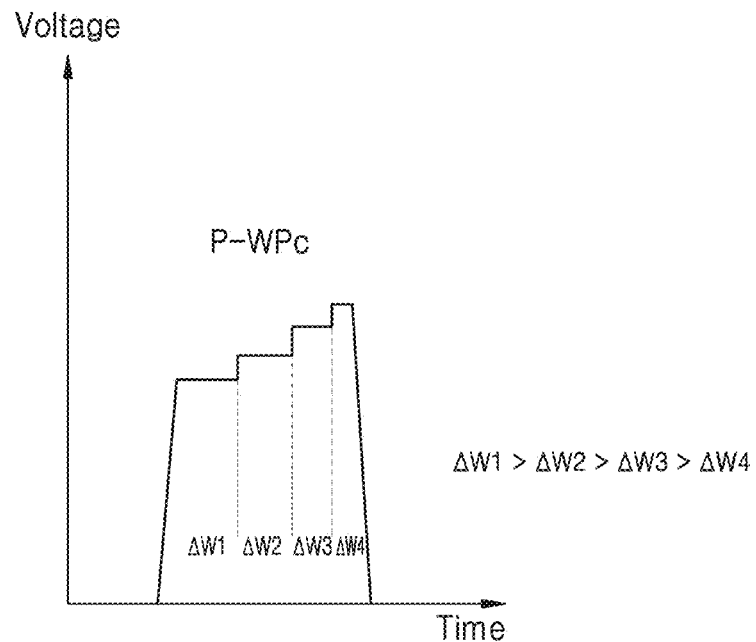

In FIG. 11C, widths of first to fourth stepped voltage levels (1), (2), (3), and (4) of a post-write pulse P-WPc may be set as respectively different values. It is assumed that the width of the first stepped voltage level (1) of the post-write pulse P-WPc is ΔW1, the width of the second stepped voltage level (2) of the post-write pulse P-WPc is ΔW2, the width of the third stepped voltage level (3) of the post-write pulse P-WPc is ΔW3, and the width of the fourth stepped voltage level (4) of the post-write pulse P-WPc is ΔW4. The widths of the first to fourth stepped voltage levels (1), (2), (3), and (4) of the post-write pulse P-WPc may be set as gradually reduced values (e.g., ΔW1>ΔW2>ΔW3>ΔW4).

Figure 11D:
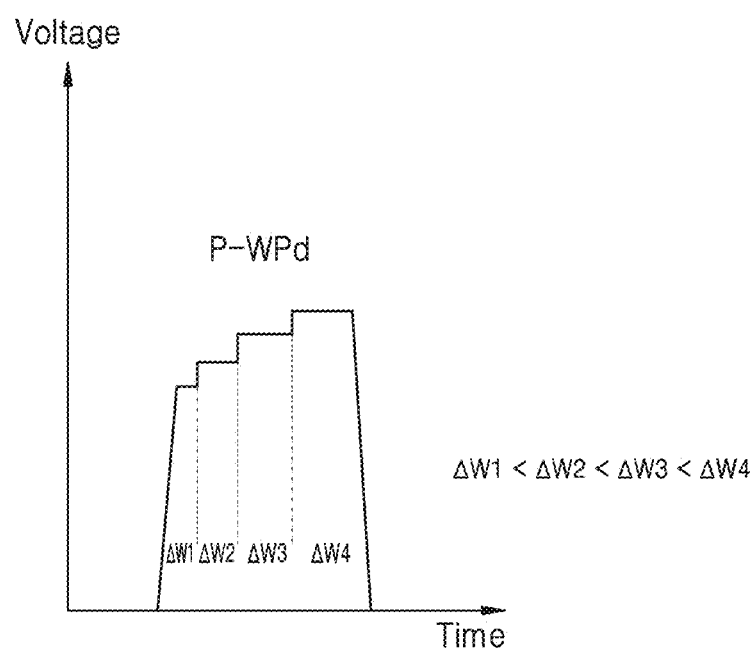

In FIG. 11D, widths of first to fourth stepped voltage levels (1), (2), (3), and (4) of a post-write pulse P-WPd may be set as gradually increased values ΔW1<ΔW2<ΔW3<ΔW4).

According to some example embodiments, the amplitudes and/or widths of the first to fourth stepped voltage levels (1), (2), (3), and (4) of the post-write pulses P-WPa, P-WPb, P-WPc, and P-WPd described with reference to FIGS. 11A to 11D may be optionally combined and/or modified. For example, as described with reference to FIGS. 10A to 10D, the first stepped voltage level (1) or VSP1 of each of the post-write pulses P-WPa, P-WPb, P-WPc, and P-WPd may be set to be lower than a minimum threshold voltage level VMS of a target resistance state (e.g., a high-resistance state HRS) of a previous write pulse WP, and an n-th stepped voltage level of each of the post-write pulses P-WPa, P-WPb, P-WPc, and P-WPd may be set to be lower than a minimum threshold voltage level of a target resistance state (e.g., an (n−1)-th post high-voltage state) that is changed by an (n−1)-th stepped voltage level of each of the post-write pulses P-WPa, P-WPb, P-WPc, and P-WPd. Thus, the memory cell MC may be prevented from being reprogrammed to a resistance state other than the target resistance state.

Figure 12:
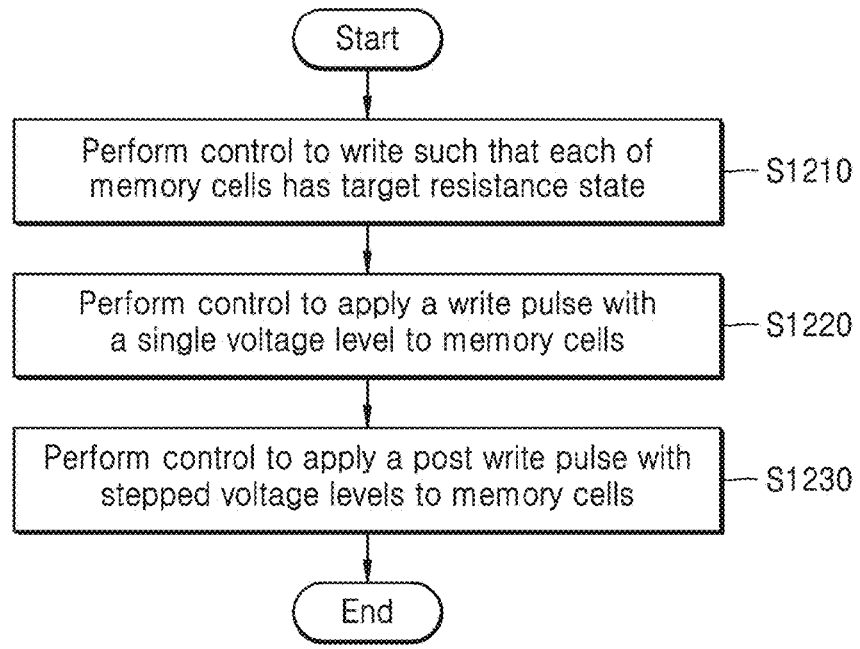
FIG. 12 is a flowchart of a method of writing a memory device, according to some example embodiments.

FIG. 12 is a flowchart of a method of writing a memory device, according to some example embodiments.

Referring to FIGS. 1, 2, 9, and 12, in operation S1210, the memory device 10 may perform a write operation via the control of the memory controller 5 over a write operation. The control circuitry 13 of the memory device 10 may control each of the memory cells MC of all or some regions of memory blocks in the memory cell array 11 to be programmed to a target resistance state. The target resistance state may be a resistance state having a relatively high resistance level a reset-directional resistance state), from among $2^m$ resistance states (m is a natural number) to which the memory cells MC are programmed.

In operation S1220, the control circuitry 13 may control a write pulse WP having a single voltage level to be applied to the memory cells MC in the write operation. The memory cells MC may be switched to the target resistance state in response to the write pulse WP.

In operation S1230, the control circuitry 13 may control a post-write puke P-WP, which follows the write pulse WP, to be applied to the memory cells MC. The control circuitry 13 may control the post-write pulse P-WP to be provided as a single pulse having at least n stepped voltage levels (n is an integer equal to or more than 2) to the memory cells MC, according to some example embodiments. The control circuitry 13 may control amplitudes and/or widths of the at least n stepped voltage levels to be variously changed, according to some example embodiments.

In the above-described method of writing the memory device 10, since the post-write pulse P-WP is applied to the memory cells MC, a resistance of the memory cells MC that are in the target resistance state is moved to higher resistance. Thus, the memory device 10 may extend a read window Wread_extend between a dispersion caused by a low-resistance state LRS and a dispersion caused by the post-write pulse P-WP and ensure a read margin of the memory cells MC, thereby reducing read errors.

Figure 13:
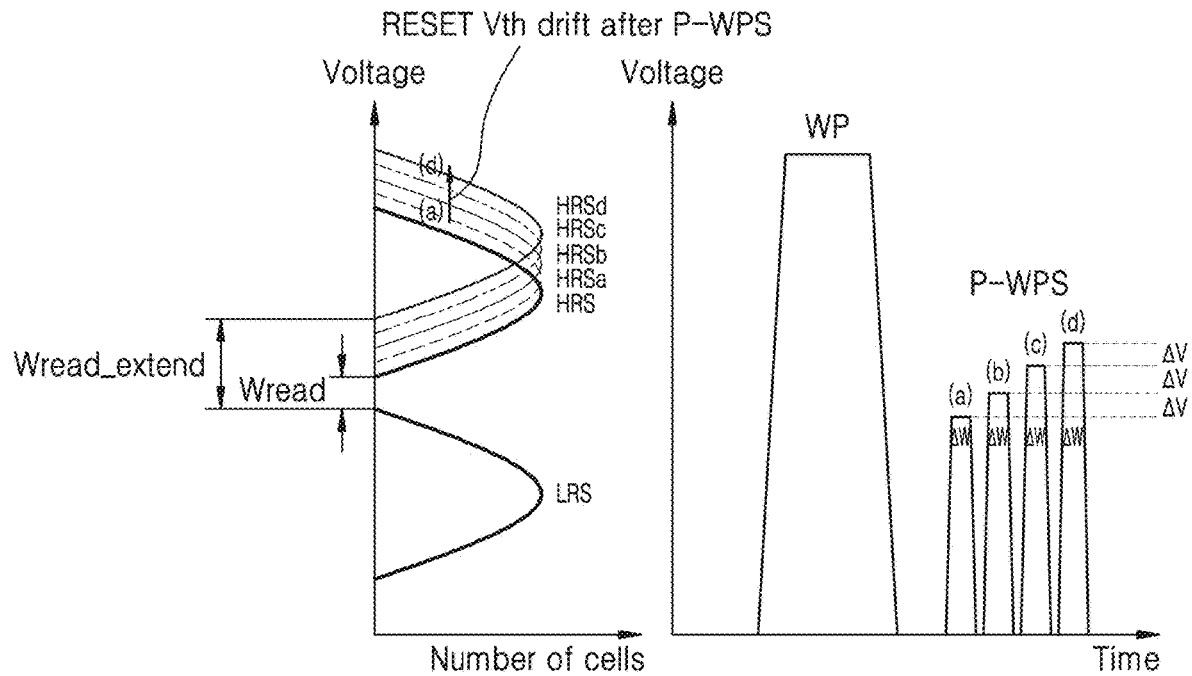
FIG. 13 is a diagram for explaining a method of operating a memory device, according to some example embodiments.

FIG. 13 is a diagram for explaining a method of operating a memory device, according to some example embodiments.

Referring to FIG. 13, an operation of programming reset data may be performed using four post-write pulses P-WPS instead of the single post-write pulse P-WP having the four stepped voltage levels (1), (2), (3), and (4) described with reference to FIG. 9. Although FIG. 13 illustrates the four post-write pulses P-WPS, example embodiments of the inventive concepts are not limited thereto, and various numbers of post-write pulses P-WPS may be used according to some other example embodiments.

When a write pulse WP is provided to the memory cell MC, a reset write current (refer to Irst in FIG. 5) may be applied to the memory cell MMC so that the memory cell MC may be switched to a high-resistance state HRS. The post-write pulses P-WPS, which may follow the write pulse WP, may be provided to the memory cell MC. The post-write pukes P-WPS may be provided as at least n multi-pulses (n is an integer equal to or more than 2). Hereinafter, a non-limiting example in which the post-write pulses P-WPS include four post-write pukes (a), (b), (c), and (d) will be described.

The first to fourth post-write pukes (a), (b), (c), and (d) of the post-write pulses P-WPS may increase with a constant amplitude ΔV, according to some example embodiments. Also, each of the first to fourth post-write pulses (a), (b), (c), and (d) of the post-write pukes P-WPS may have a constant width ΔW, according to some example embodiments.

When the post-write pulses P-WPS are applied to the memory cell MC, the memory cell MC may be changed from the high-resistance state HRS caused by the write pulse WP to first to fourth post high-resistance states HRSa to HRSd. The first to fourth post high-resistance states HRSa to HRSd may be moved in a direction in which a resistance of the high-resistance state HRS increases in response to the post-write pulses P-WPS. Thus, a read window Wread between a dispersion caused by a low-resistance state LRS and a dispersion caused by the high-resistance state HRS due to the write pulse WP may extend to an extended read window Wread_extend between the dispersion caused by the low-resistance state LRS and a dispersion caused by the fourth post high-resistance state HRSd due to the fourth post-write pulse (d).

FIGS. 14A to 14D are graphs illustrating the post-write pulses P-WPS of FIG. 13, according to some example embodiments. FIGS. 14A to 14D specifically illustrate first, second, third, and fourth post-write pulses (a), (b), (c), and (d) of the post-write pulses P-WPS, respectively.

Figure 14A:
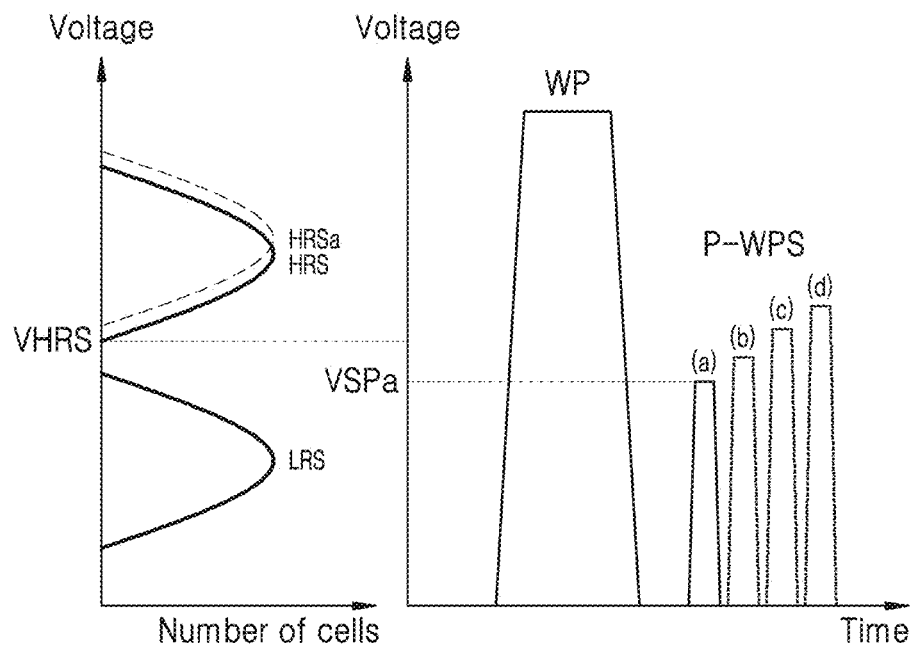
FIGS. 14A to 14D are graphs illustrating post-write pulses of FIG. 13, according to some example embodiments.

In FIG. 14A, the memory cell (refer to MC in FIG. 3) may be switched to a high-resistance state FIRS in response to a write pulse WP provided to the memory cell MC. The memory cell MC that is in the high-resistance state HRS may have a threshold voltage equal to or higher than a minimum threshold voltage VHRS required fir switching the memory cell MC to the high-resistance state HRS. The first post-write pulse (a) may be set to have a voltage level VSPa, which is lower than the minimum threshold voltage VHRS of the high-resistance state HRS. The memory cell MC may be switched to the first post high-resistance state HRSa in response to the first post-write pulse (a) provided to the memory cell (refer to MC in FIG. 3).

Figure 14B:
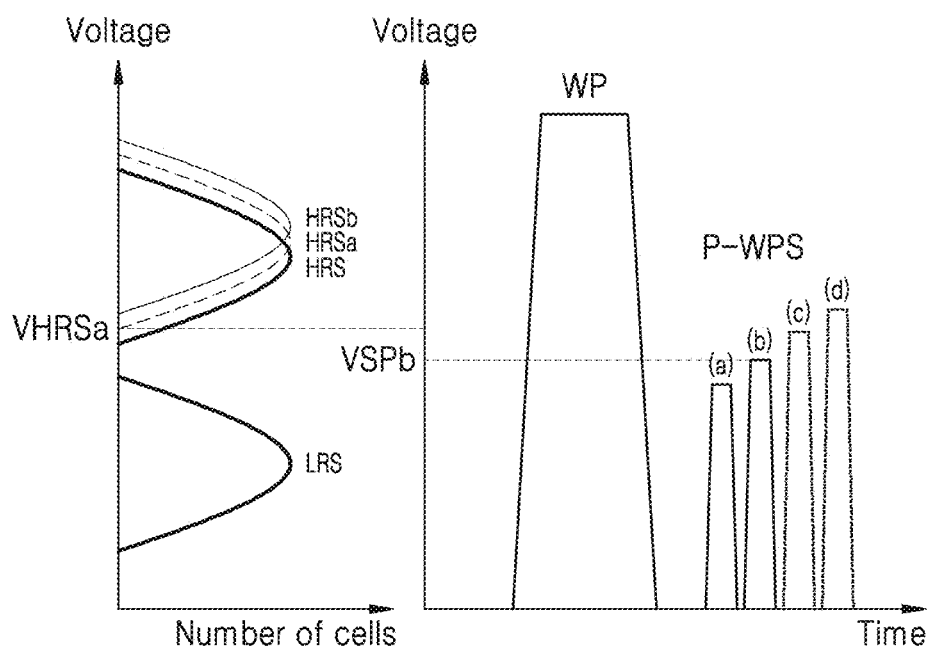

In FIG. 14B, the second post-write pulse (b) may be set to have a voltage level VSPb, which is lower than a minimum threshold voltage VHRSa of the first post high-resistance state HRSa. The memory cell MC may be switched to a second post high-resistance state HRSb in response to the second post-write pulse (b) provided to the memory cell (refer to MC in FIG. 3).

Figure 14C:
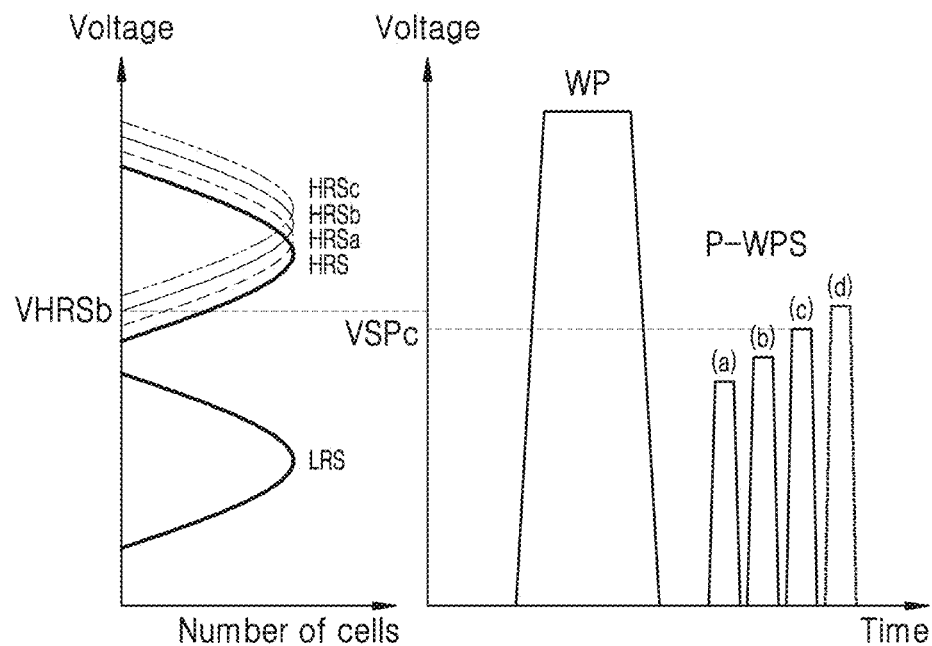

In FIG. 14C, the third post-write pulse (c) may be set to have a voltage level VSPc, which is lower than a minimum threshold voltage VHRSh of the second post high-resistance state HRSb. The memory cell MC may be switched to a third post high-resistance state HRSc in response to the third post-write pulse (c) provided to the memory cell (refer to MC in FIG. 3).

Figure 14D:
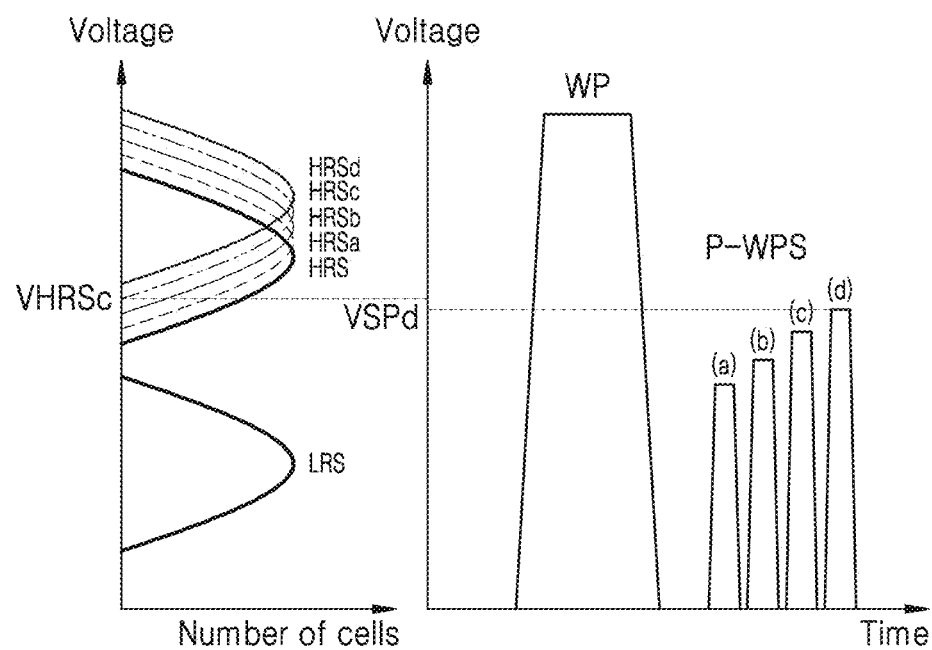

In FIG. 14D, the fourth post-write pulse (d) may be set to have a voltage level VSPd, which is lower than a minimum threshold voltage VHRS3 of the third post high-resistance state HRSc. The memory cell MMC may be switched to a fourth post high-resistance state HRSd in response to the fourth post-write pulse (d) provided to the memory cell (refer to MC in FIG. 3).

In FIGS. 14A to 14D, a voltage level VSPa of the first post-write pulse (a) may be set to be lower than a level of the minimum threshold voltage VHRS of a target resistance state (e.g., the high-resistance state HRS) due to a previous write pulse WP. A voltage level of an n-th post-write pulse may be set to be lower than a minimum threshold voltage level of a target resistance state (e.g., an (n−1)-th high-voltage state) that is changed by an (n−1)-th post-write pulse.

Here, the voltage level of the n-th post-write pulse may be set to be lower than the minimum threshold voltage level of the (n−1)-th high-voltage state that s changed by the (n−1)-th post-write pulse so that the memory cell MC may be prevented from being reprogrammed into a resistance state other than the target resistance state. The memory cell MC may be programmed to a target resistance state having a relatively high resistance level, from among $2^m$ resistance states (m is a natural number). As a non-limiting example, it is assumed that the target resistance state of the memory cell MC is the second resistance state RS2 in the MLC of FIG. 8. In this case, when the voltage level of the n-th post-write pulse is set to be higher than the minimum threshold voltage level of the (n−1)-th high-voltage state, the memory cell MC may be programmed not to the second resistance state RS2, but rather may be programmed to the third resistance state RS3 or the fourth resistance state RS4.

FIGS. 15A to 15D are graphs illustrating modified examples of the post-write pulses P-WPS of FIG. 13, according to some other example embodiments. FIGS. 15A to 15D illustrate non-limiting examples in which the post-write pulses P-WPS are set to have various amplitudes (e.g., refer to FIGS. 15A and 15B) and/or widths (e.g., refer to FIGS. 15C and 15D).

Figure 15A:
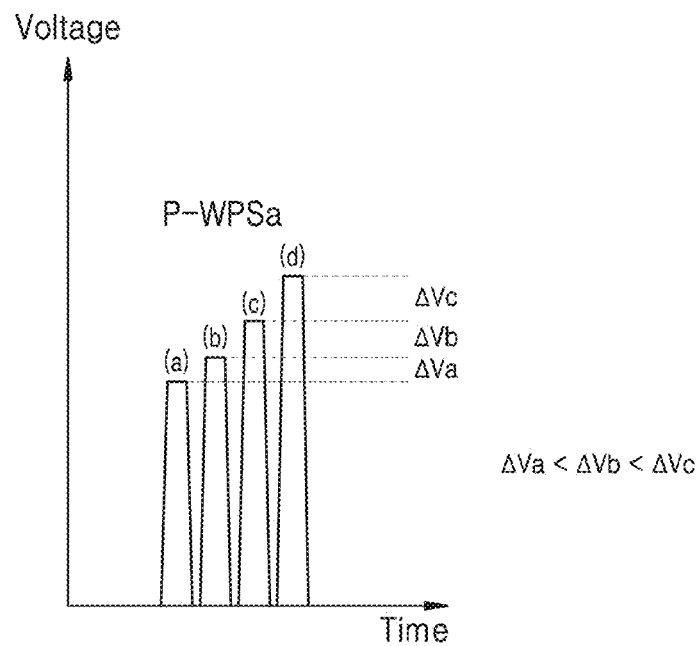
FIGS. 15A to 15D are graphs illustrating modified examples of the post-write pulses of FIG. 13, according to some other example embodiments.

In FIG. 15A, first to fourth post-write pulses (a), (b), (c), and (d) of post-write pulses P-WPSa may increase with different amplitudes. It is assumed that a voltage difference between the first post-write pulse (a) and the second post-write pulse (h) is ΔVa, a voltage difference between the second post-write pulse (b) and the third post-write pulse (c) is ΔVb, and a voltage difference between the third post-write pulse (c) and the fourth post-write pulse (d) is ΔVc. The amplitudes of the first to fourth post-write pulses (a), (b), (c), and (d) of the post-write pulses P-WPSa may be set as gradually increased values (e.g., ΔVa<ΔVb<ΔVc).

Figure 15B:
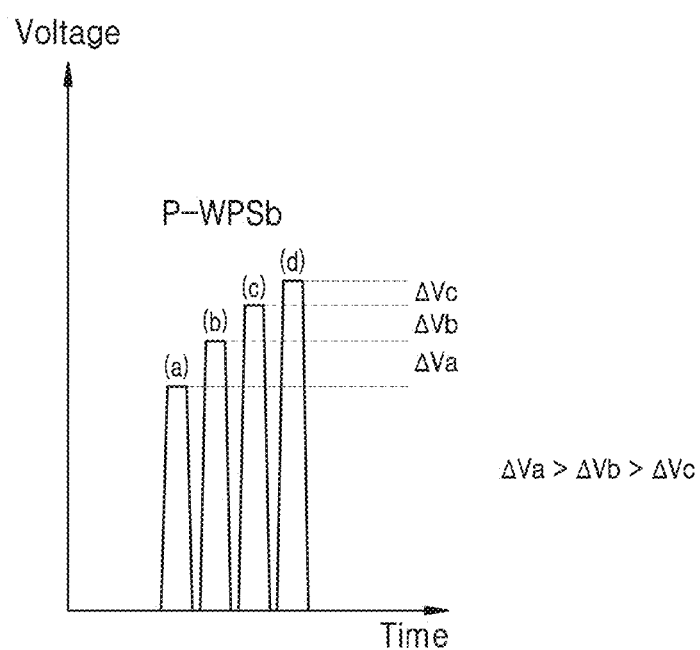

In FIG. 15B, amplitudes of first to fourth post-write pulses (a), (b), (c), and (d) of post-write pulses P-WPSb may be set as gradually reduced values (e.g., ΔVa>ΔVb>ΔVc).

Figure 15C:
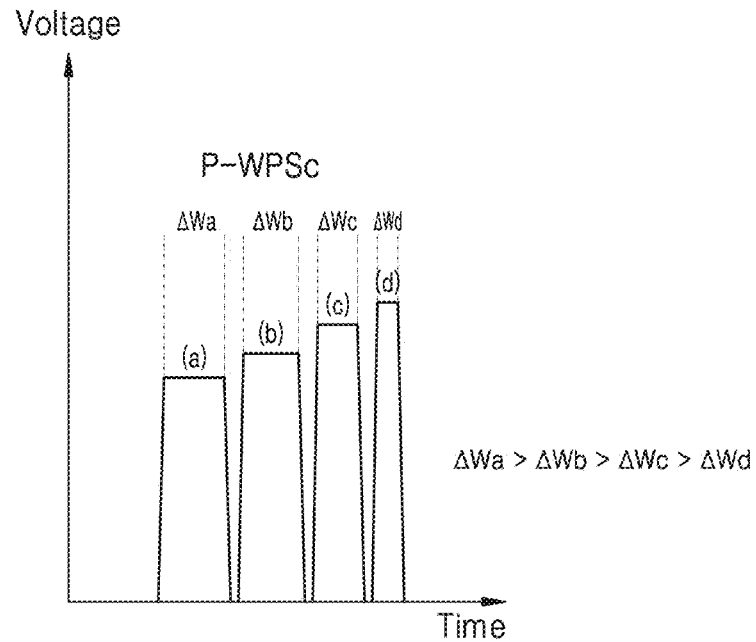

In FIG. 15C, widths of first to fourth post-write pulses (a), (b), (c), and (d) of post-write pulses P-WPSc may be set as respectively different values. It is assumed that the width of the first post-write pulse (a) is ΔWa, a width of the second post-write pulse (b) is ΔWb, the width of the third post-write pulse (c) is ΔWc, and the width of the fourth post-write pulse (d) is ΔWd. The widths of the first to fourth post-write pulses (a), (b), (c), and (d) of the post-write pulses P-WPSc may be set as gradually reduced values (e.g., ΔWa>ΔWb>ΔWc>ΔWd).

Figure 15D:
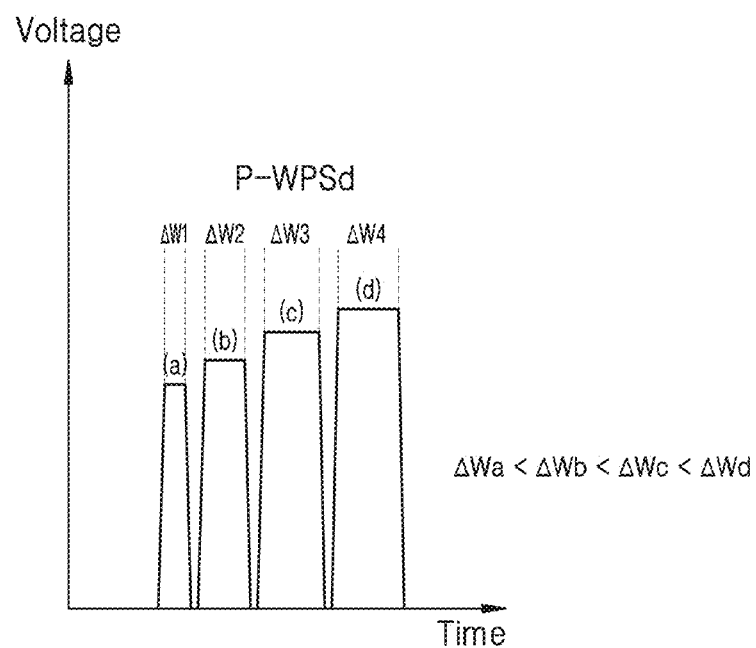

In FIG. 15D, widths of first to fourth post-write pulses (a), (b), (c), and (d) of post-write pulses P-WPSd may be set as gradually increased values (e.g., ΔWa<ΔWb<ΔWc<ΔWd).

According to some example embodiments, the amplitudes and/or widths of the first to fourth post-write pulses (a), (b), (c), and (d) of the post-write pulses P-WPSa, P-WPSb, P-WPSc, and P-WPSc described with reference to FIGS. 15A to 15D may be optionally combined and/or modified. As an example, as described with reference to FIGS. 14A to 14D, a first voltage level VSPa of the first post-write pulse (a) of the post-write pulses P-WPSa, P-WPSb, P-WPSc, and P-WPSd may be set to be lower than a minimum threshold voltage level VHRS of a target resistance state (e.g., a high-resistance state HRS) due to a previous write pulse WP, and a voltage level of an n-th post-write pulse of the post-write pulses P-WPSa, P-WPSb, P-WPS, P-WPSc, and P-WPSd may be set to be lower than a minimum threshold voltage level of a target resistance state (e.g., an (n−1)-th post high-voltage state) that is changed by an (n−1)-th post-write pulse.

Figure 16:
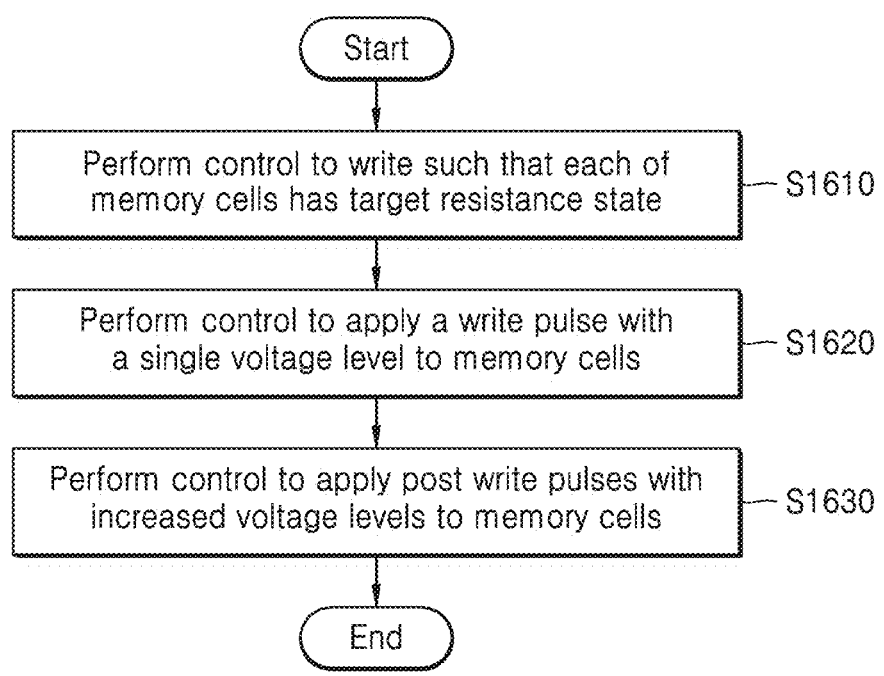
FIG. 16 is a flowchart of a method of writing a memory device, according to some example embodiments.

FIG. 16 is a flowchart of a method of writing a memory device, according to some example embodiments.

Referring to FIGS. 1, 2, 13, and 16, in operation S1610, the memory device 10 may perform a write operation via the control of the memory controller 5 over the write operation. The control circuitry 13 of the memory device 10 may control each of the memory cells MC of all or some regions of memory blocks in the memory cell array 11 to be programmed to a target resistance state. The target resistance state may be a resistance state having a relatively high resistance level (i.e., a reset-directional resistance state), from among $2^m$ resistance states (m is a natural number) to which the memory cells MC are programmed.

In operation S1620, the control circuitry 13 may control a write pulse WP having a single voltage level to be applied to the memory cells MC in the write operation. The memory cells MC may be switched to the target resistance state in response to the write pulse WP.

In operation S1630, the control circuitry 13 may control post-write pulses P-WPS, which follow the write pulse WP, to be applied to the memory cells MC. The control circuitry 13 may control post-write pulses P-WPS including at least n multi-pulses (n is an integer equal to or more than 2) to be provided to the memory cells MC, according to some example embodiments. The control circuitry 13 may control amplitudes and/or widths of at least n post-write pulses P-WPS to be variously changed, according to some example embodiments.

In the above-described method of writing the memory device 10, since the post-write pulses P-WPS are applied as n multi-pulses to the memory cells MC, a resistance of the memory cells MC that are in the target resistance state is moved to higher resistance. Thus, the memory device 10 may extend a read window Wread_extend between a dispersion caused by low-resistance state LRS and a dispersion caused by the post-write pulses P-WPS and ensure a read margin of the memory cells MC, thereby reducing read errors.

Figure 17:
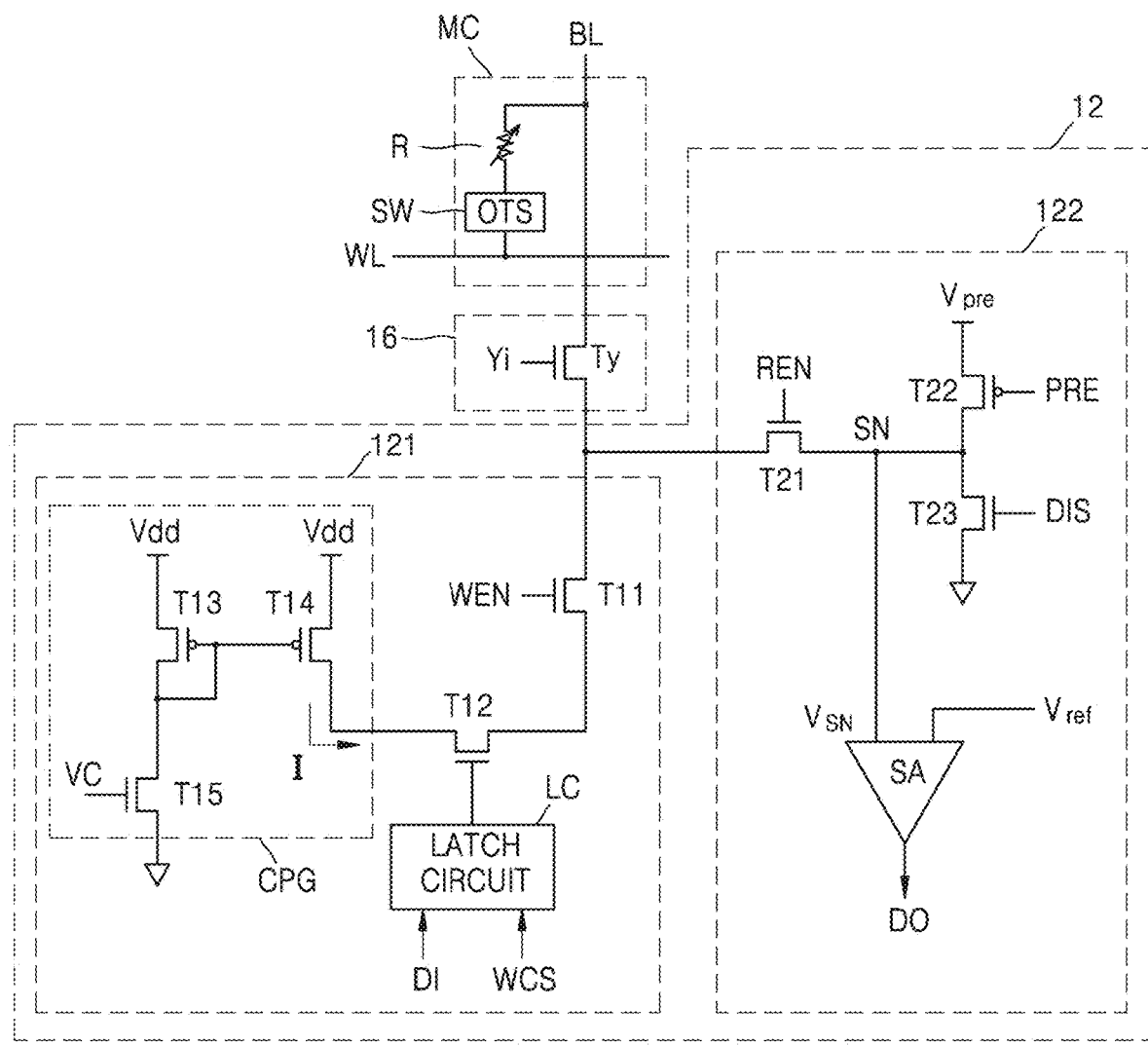
FIG. 17 is a circuit diagram of a write/read circuit of a memory device according to some example embodiments.

FIG. 17 is a circuit diagram of a write/read circuit 12 of a memory device according to some example embodiments.

Referring to FIG. 17, a memory cell MC may be located at a region in which a bit line BL intersects a word line WL and may include a variable resistive element R and a selection element SW. A column decoder 16 may include a bit line selection transistor Ty, which may connect the memory cell MC to a write/read circuit 12 in response to a column selection signal Yi. The write/read circuit 12 may include a write circuit 121 and a read circuit 122. Hereinafter, a case in which the column selection signal Yi is activated to connect the memory cell MC to the write/read circuit 12 will be described.

The write circuit 121 may provide a write current I for programming the memory cell MC. The write circuit 121 may include first and second transistors T11 and T12, a current pulse provider CPG, and a latch circuit LC. When a write enable signal WEN is activated, the first transistor T11 may be turned on, so that the write circuit 121 may be connected to the memory cell MC.

The current pulse provider CPG may include third, fourth, and fifth transistors T13, T14, and T15. The third and fourth transistors T13 and T14 may constitute a current mirror, and the fifth transistor T15 may provide the write current I in response to a control voltage VC applied to a gate of the fifth transistor T15. The control voltage VC may be applied as the types of the write pulse WP, the post-write pulse P-WP, and/or the post-write pulses P-WPS described with reference to FIGS. 9 to 13.

The latch circuit LC may output a gate voltage such that the second transistor T12 is selectively turned on according to a logic level of input data DI in response to a write control signal WCS. The input data DI may be data derived from data DATA provided by the memory controller 5.

In some example embodiments, when the write control signal WCS indicates a reset-directional write operation, the latch circuit LC may turn on the second transistor T12 when a logic level of the input data DI is '0', and may turn off the second transistor T12 when the logic level of the input data DI is '1.'

In some other example embodiments, when the write control signal WCS indicates a set-directional write operation, the latch circuit LC may turn off the second transistor T12 when a logic level of the input data DI is '0,' and may turn on the second transistor T12 when the logic level of the input data DI is '1.'

The read circuit 122 may read data stored in the memory cell MC. The read circuit 122 may include first, second, and third transistors T21, T22, and T23 and a sense amplifier SA. When a read enable signal REN is activated, the first transistor T21 may be turned on and the read circuit 122 may be connected to the memory cell MC.

When a precharge signal PRE is activated, the second transistor T22 may be turned on and the bit line BL may be precharged to a precharge voltage Vpre. On the other hand, when a discharge signal DIS is activated, the third transistor T23 may be turned on and the bit line BL may be discharged to a ground and voltage.

The sense amplifier SA may compare a voltage VSN of a sensing node SN with a reference voltage Vref, and may output output data DO indicating whether the memory cell MC is in an on state or an off state based on a result of the comparison. The reference voltage Vref may be set as read voltages (e.g., refer to VR1 to VR3 in FIG. 9). The output data DO may be provided as data DATA to the outside of the memory device 10, for example, to the memory controller 5.

Figure 18:
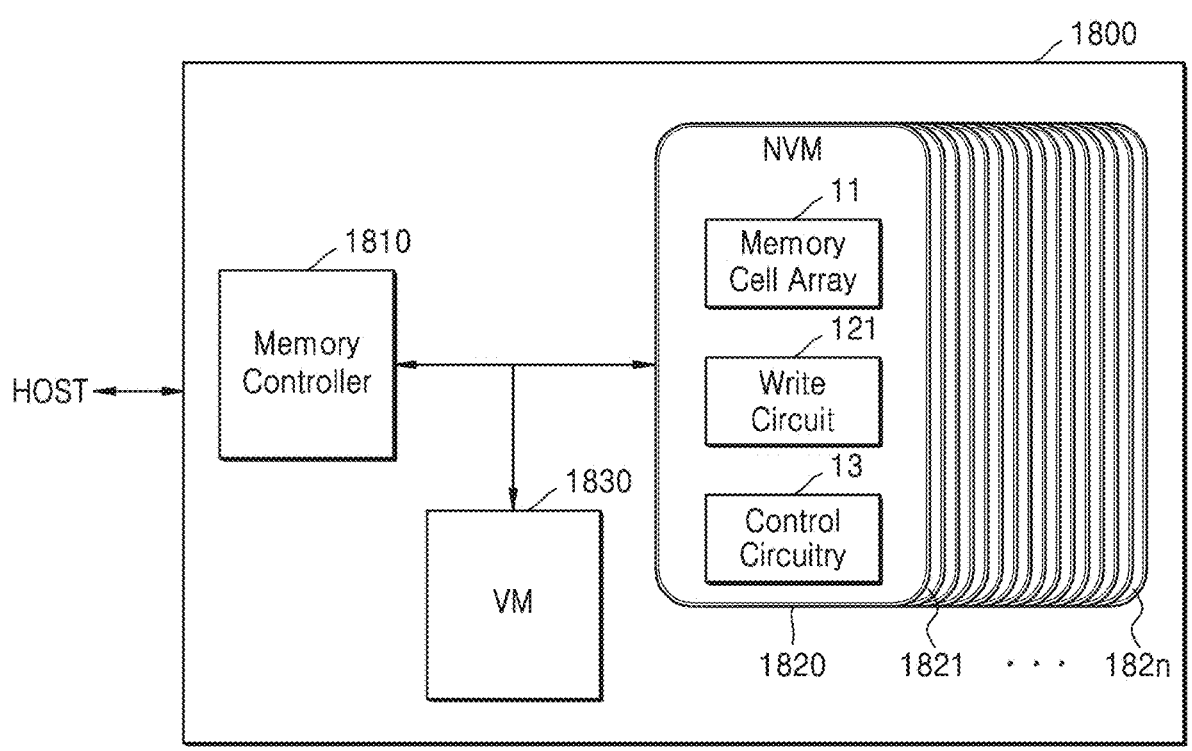
FIG. 18 is a block diagram of a configuration of a memory system adopting a memory device according to some example embodiments.

FIG. 18 is a block diagram of a configuration of a memory system 1800 adopting a memory device (e.g., refer to memory device 10 of FIG. 1) according to some example embodiments.

Referring to FIG. 18, the memory system 1800 may include a memory controller 1810, a plurality of non-volatile memory devices 1820 to 182n, and a volatile memory device 1830. The memory controller 1810 may control a write operation and/or a read operation of the plurality of non-volatile memory devices 1820 to 182n in response to a request from a host HOST connected to the memory system 1800. The memory controller 1810 (or a processing unit thereof) may be implemented as a microprocessor (MP) or a central processing unit (CPU) configured to execute an operating system and/or software programs and perform specific calculations and/or tasks.

In some example embodiments, the host HOST may be an arbitrary computing system, such as a personal computer (PC), a server computer, a workstation, a laptop computer, a mobile phone, a smartphone, a personal digital assistant (PDA), a portable multimedia player (PMP), a digital camera, a digital television (digital TV), a set-top box, a music player, a portable game console, and/or a navigation system.

The plurality of non-volatile memory devices 1820 to 182n may be used as storage media of the memory system 1800. Each of the non-volatile memory devices 1820 to 182n may be, for example, a resistive memory device. The plurality of non-volatile memory devices 1820 to 182n may be connected to the memory controller 1810 through a channel. Each of the non-volatile memory devices 1820 to 182n may perform a write operation and/or a read operation in response to a request provided from the host HOST through the channel.

The volatile memory device 1830 may temporarily store write data provided from the host HOST and/or read data from the non-volatile memory devices 1820 to 182n. The volatile memory device 1830 may store metadata and/or cache data to be stored in the non-volatile memory devices 1820 to 182n. The volatile memory device 1830 may include dynamic RAM (DRAM) or static RAM (SRAM), for example.

Each of the non-volatile memory devices 1820 to 182n may be a resistive memory device corresponding to the memory device 10 described with reference to FIGS. 1 to 17. Each of the non-volatile memory devices 1820 to 182n may include a memory cell array 11 including memory cells, a write circuit 121 configured to program the memory cells to a target resistance state, and a control circuitry 13 configured to control a write pulse and post-write pulse(s), which follow the write pulse, to be applied to the memory cells. The memory cells may be programmed to the target resistance state in response to the write pulse, and a resistance of the memory cells that are in the target resistance state may increase in response to the post-write pulse.

Figure 19:
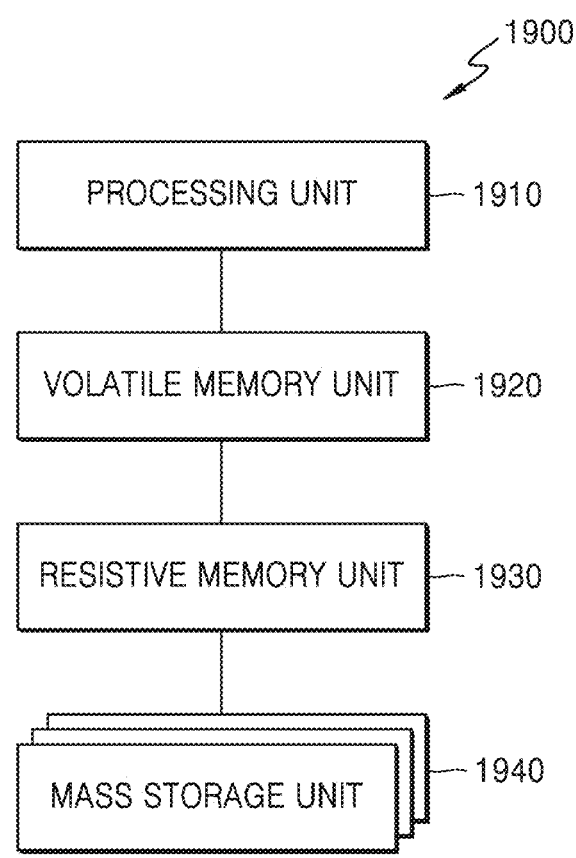
FIG. 19 is a block diagram of a system to which a memory device according to some example embodiments is applied.

FIG. 19 is a block diagram of a system 1900 to which a memory device according to some example embodiments is applied.

Referring to FIG. 19, the system 1900 may include a processing unit 1910, a volatile memory unit 1920, a resistive memory unit 1930, and a mass storage unit 1940. The system 1900 may be a general-use or exclusive-use computer system, such as a mobile device, a personal computer (PC), a server computer, a programmable household electric appliance, and/or a mainframe computer.

A functional "unit" described in connection with some example embodiments according to FIG. 19 may be classified as a module for implementation independence. For example, the module may be implemented as a custom very-large-scale-integration (VLSI) circuit or a hardware circuit including a ready-made semiconductor, such as a gate array, a logic chip, a transistor, and/or another discrete component, for example. The module may be implemented as a programmable hardware device, for example, a programmable gate array, a programmable gate logic, and a programmable gate device. Furthermore, the module may be implemented as such hardware circuitry or hardware devices in combination with software including an executable code, an object, a procedure, and/or a function, for example. Those having ordinary skill in the art will also appreciate that each functional unit or module of the system 1900 may be implemented by separate hardware circuitry or hardware devices according to some example embodiments, and that multiple functional units or modules of the system 1900 may be implemented in combination by a single hardware circuit or hardware device according to some other example embodiments.

The processing unit 1910 may execute an operating system and a plurality of software programs and perform specific calculations and/or tasks. The processing unit 1910 may be a microprocessor (MP) or a central processing unit (CPU), for example.

The volatile memory unit 1920 may refer to a medium configured to store data for a short period of time or temporarily as an operating memory or cache memory of the system 1900. The volatile memory unit 1920 may include at least one memory device, for example, a DRAM.

The resistive memory unit 1930 may be used as a cache for the mass storage unit 1940. Frequently accessed data and/or some data of an application and/or an operating system may be stored in the resistive memory unit 1930. The resistive memory unit 1930 may include at least one memory device (e.g., PRAM). The resistive memory unit 1930 may be useful as a cache because data is accessed by the resistive memory unit 1930 at a higher speed than when data is accessed by the mass storage unit 1940 (e.g., a hard disk drive (HDD)). The resistive memory unit 1930 may be implemented with reference to some example embodiments shown in FIGS. 1 to 17.

The resistive memory unit 1930 may include a memory cell array including memory cells, a write circuit configured to program the memory cells to a target resistance state, and a control circuitry 13 configured to control a write puke and post-write pulse(s), which follow the write pulse, to be applied to the memory cells. The memory cells may be programmed to the target resistance state in response to the write puke, and a resistance of the memory cells that are in the target resistance state may increase in response to the post-write pulse.

The mass storage unit 1940 may be implemented as a hard disk drive (HDD), a solid state drive (SSD), a peripheral component interconnect express (PCI-e) memory module, or non-volatile memory express (NVMe). Optionally, at least one tier of the mass storage unit 1940 may be implemented as at least one network accessible device and/or service, for example, several clients, several servers, server farm(s), server cluster(s), application server(s), and/or message server(s), which are connected to NVMe-over Fabrics (NVMe-oF) and/or remote direct memory access (RDMA). The mass storage unit 1940 may refer to a storage medium in which the system 1900 intends to store user data over a long period of time. The mass storage unit 1940 may store an application program, program data, and the like.

As discussed above, various components of a memory controller (e.g., a processing unit) and/or a memory device (e.g., a write/read circuit and/or a control circuitry) may be implemented as hardware or a combination of hardware and software. When a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, some example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to some example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing some example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or lore storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium. While the inventive concepts have been particularly shown and described with reference to some example embodiments thereof, it will be understood that various changes in form and details may be made therein without departing from the spirit and scope of the following claims.

What is claimed is:

1. A resistive memory device comprising:
   a memory cell array including a plurality of memory cells, a memory cell comprising a memory element programmable to a plurality of resistance states;
   a write circuit configured to program the memory cell to a target resistance state; and
   a control circuitry configured to control a write pulse and a post-write pulse to be applied to the memory cell, wherein
      the post-write pulse follows the write pulse,
      the memory cell is programmed to the target resistance state in response to the write pulse, and
      a resistance of the memory cell that is in the target resistance state is increased in response to the post-write pulse,
      wherein the post-write pulse is a single pulse having at least n stepped-up voltage levels, n being an integer equal to or more than 2, each of the at least n stepped-up voltage levels having a time period smaller than the write pulse, and
      wherein the at least n stepped-up voltage levels have different time periods;
   wherein the target resistance state is a resistive state having a relatively high resistance level among $2^m$ resistance states to which the memory cell is programmed, m being a natural number,
   wherein the control circuitry is further configured to
      control each of the at least n stepped-up voltage levels to increase with a certain amplitude, and
      control an n-th stepped-up voltage level of the at least n stepped-up voltage levels of the post-write pulse to be applied to the memory cell such that the n-th stepped-up voltage level is lower than a minimum threshold voltage level of the target resistance state that is changed by an (n−1)-th stepped-up voltage level of the post-write pulse.

2. The resistive memory device of claim 1, wherein the control circuitry is further configured to control a first stepped-up voltage level of the at least n stepped-up voltage levels of the post-write pulse is set to be lower than a minimum threshold voltage level of the target resistance state due to the write pulse.

3. The resistive memory device of claim 1, wherein the control circuitry is further configured to control increased amplitudes of the at least n stepped-up voltage levels to be set to be equal to each other.

4. The resistive memory device of claim 1, wherein the control circuitry is further configured to control increased amplitudes of the at least n stepped-up voltage levels to be set to be different from each other.

5. The resistive memory device of claim 4, wherein the increased amplitudes of the at least n stepped-up voltage levels are set to gradually increase.

6. The resistive memory device of claim 4, wherein the increased amplitudes of the at least n stepped-up voltage levels are set to gradually decrease.

7. The resistive memory device of claim 1, wherein the memory cell comprises:
   a first electrode and a second electrode spaced apart from each other;
   a selection element located closer to the second electrode than to the first electrode between the first electrode and the second electrode, the selection element comprising a chalcogenide switching material; and
   a variable resistive element comprising a phase-change material between the first electrode and the selection element.

8. A resistive memory device comprising:
   a memory cell array including a plurality of memory cells, a memory cell comprising a memory element programmable to a plurality of resistance states;
   a write circuit configured to program the memory cell to a target resistance state; and
   a control circuitry configured to control a write pulse and at least n post-write stepped-up pulses to be applied to the memory cell, n being an integer equal to or more than 2, each of the at least n post-write stepped-up pulses having a time period smaller than the write pulse, wherein
      the at least n post-write stepped-up pulses follow the write pulse,
      the memory cell is programmed to the target resistance state in response to the write pulse, and
      a resistance of the memory cell that is in the target resistance state is increased in response to the at least n post-write stepped-up pulses,
   wherein the at least n post-write stepped-up pulses have different time periods,
   wherein the target resistance state is a resistive state having a relatively high resistance level from among $2^m$ resistance states to which the memory cell is programmed, m being a natural number,
   wherein the control circuitry is further configured to
      control the at least n post-write stepped-up pulses to increase a voltage level of each of the at least n post-write stepped-up pulses with a certain amplitude
   wherein the control circuitry is further configured to
      control a voltage level of a first post-write stepped-up pulse of the at least n post-write stepped-up pulses to be set to be lower than a minimum threshold voltage level of the target resistance state due to the write pulse, and control a voltage level of an n-th post-write stepped-up pulse of the at least n post-write stepped-up pulses to be set to be lower than a minimum threshold voltage level of the target resistance state that is changed by a voltage level of an (n−1)-th post-write stepped-up pulse.

9. The resistive memory device of claim 8, wherein the control circuitry is further configured to control voltage levels of the at least n post-write stepped-up pulses to increase with a same amplitude.

10. The resistive memory device of claim 8, wherein the control circuitry is further configured to control voltage levels of the at least n post-write stepped-up pulses to increase with different amplitudes.

11. The resistive memory device of claim 10, wherein the voltage levels of the at least n post-write stepped-up pulses increase with gradually increased amplitudes.

12. The resistive memory device of claim 8, wherein the memory cell comprises:
   a first electrode and a second electrode spaced apart from each other;
   a selection element located closer to the second electrode than to the first electrode between the first electrode and the second electrode, the selection element comprising a chalcogenide switching material; and
   a variable resistive element comprising a phase-change material between the first electrode and the selection element.

13. The resistive memory device of claim 1, wherein the post-write pulse begins a non-zero time period after the write pulse ends.

* * * * *